(12) United States Patent
Hida et al.

(10) Patent No.: US 10,005,960 B2
(45) Date of Patent: Jun. 26, 2018

(54) COMPOSITION AND POLARIZING FILM

(71) Applicant: Sumitomo Chemical Company, Limited, Tokyo (JP)

(72) Inventors: Noriyuki Hida, Osaka (JP); Haruki Okawa, Niihama (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days. days.

(21) Appl. No.: 15/335,961

(22) Filed: Oct. 27, 2016

(65) Prior Publication Data
US 2017/0121605 A1    May 4, 2017

(30) Foreign Application Priority Data
Oct. 29, 2015  (JP) .................................. 2015-213356

(51) Int. Cl.
| G02F 1/1333 | (2006.01) |
|---|---|
| C09K 19/38 | (2006.01) |
| C09K 19/60 | (2006.01) |
| G02F 1/1335 | (2006.01) |
| H01L 51/00 | (2006.01) |
| H01L 51/52 | (2006.01) |
| C09K 19/04 | (2006.01) |
| C09K 19/30 | (2006.01) |

(52) U.S. Cl.
CPC ........ C09K 19/3852 (2013.01); C09K 19/601 (2013.01); G02F 1/133528 (2013.01); H01L 51/004 (2013.01); H01L 51/0043 (2013.01); H01L 51/0076 (2013.01); H01L 51/5293 (2013.01); C09K 2019/0448 (2013.01); C09K 2019/3075 (2013.01); C09K 2219/03 (2013.01); G02F 2001/133541 (2013.01)

(58) Field of Classification Search
CPC .............. C09K 19/3852; C09K 19/601; C09K 2019/0448; C09K 2019/3075; C09K 2219/03; G02F 1/1333; G02F 1/133528; G02F 2001/133541; H01L 51/004; H01L 51/0043; H01L 51/0076; H01L 51/5293
USPC .............................. 252/299.1, 299.6; 428/1.1
See application file for complete search history.

(56) References Cited

U.S. PATENT DOCUMENTS

| 9,599,759 B2 * | 3/2017 | Hatanaka ........... B29D 11/0073 |
| 9,644,148 B2 * | 5/2017 | Hida ..................... C09K 19/601 |
| 2007/0024970 A1 | 2/2007 | Lub et al. |

FOREIGN PATENT DOCUMENTS

| JP | H1060446 A | 3/1998 |
| JP | 2007510946 A | 4/2007 |
| JP | 2013101328 A | 5/2013 |

OTHER PUBLICATIONS

Handbook of Chemistry, Elementary Edition, Revised Fifth Edition, II-379 to II-380.

* cited by examiner

*Primary Examiner* — Geraldina Visconti
(74) *Attorney, Agent, or Firm* — Panitch Schwarze Belisario & Nadel LLP

(57) ABSTRACT

Provided is a composition which is to be a raw material of a polarizing film having excellent light fastness. The composition includes a polymerizable liquid crystal compound and a compound represented by the following formula (1):

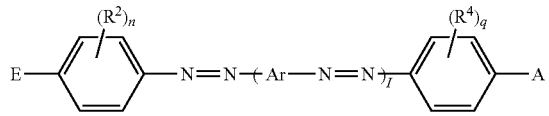

(1)

wherein E represents an electron attractive group having at least 3 carbon atoms or the following group:

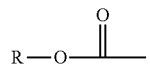

wherein R represents a hydrogen atom or a hydrocarbon group having 1 to 20 carbon atoms;
Ar represents a group selected from the following groups:

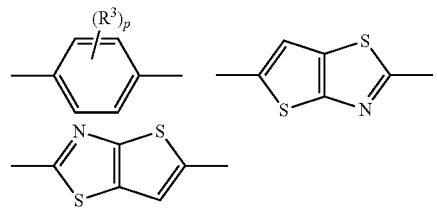

and A represents a group selected from the following groups:

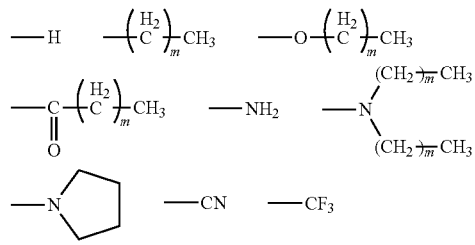

wherein $R^2$, $R^3$ and $R^4$, and l, m, n, p, and q are defined in the specification.

13 Claims, No Drawings

COMPOSITION AND POLARIZING FILM

BACKGROUND OF THE INVENTION

Field of the Invention

The present invention relates to a composition containing a compound that functions as a dichroic dye and also to a polarizing film containing the compound.

Description of the Related Art

JP-T-2007-510946 (published on Apr. 26, 2007) and JP-A-2013-101328 (published on May 23, 2013) describe a polarizing film containing a compound (dichroic dye) dispersed in an oriented polymerizable liquid crystal compound, and absorbing dichroic light.

SUMMARY OF THE INVENTION

There is, however, the case where a polarizing film having a conventional dichroic dye is decreased in its absorbance in a condition where it is irradiated with light.

The above problem can be solved by the present invention including the following inventions.

<1> A composition comprising a compound represented by the following formula (1) and a polymerizable liquid crystal compound:

[Chemical 1]

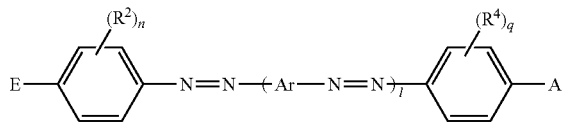

(1)

wherein E represents an electron attractive group having 3 or more carbon atoms or the following group:

[Chemical 2]

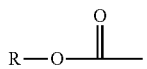

wherein E represents a hydrogen atom or a hydrocarbon group having 1 to 20 carbon atoms;

Ar represents a group selected from the following groups:

[Chemical 3]

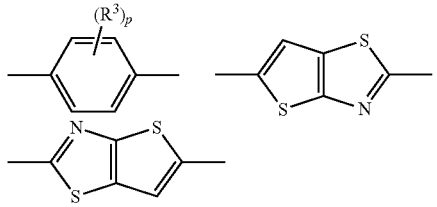

and A represents a group selected from the following groups:

[Chemical 4]

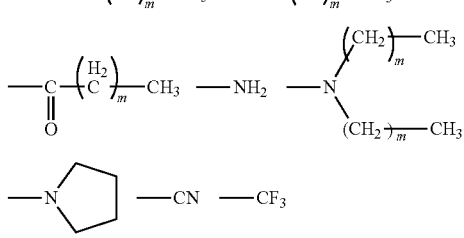

wherein $R^2$ through $R^4$, which are substituents other than a hydrogen atom, respectively represent an alkyl group having 1 to 4 carbon atoms, an alkoxy group having 1 to 4 carbon atoms, a halogen atom, or a cyano group, wherein one or more hydrogen atoms constituting the above alkyl group and alkoxy group may be substituted with a halogen atom or a hydroxy group, l denotes 1 or 2, m denotes an integer from 0 to 10 provided that when two m(s) are present in the same group, they may be the same or different, and n, p, and q respectively denote an integer from 0 to 2.

<2> The composition according to the above <1>, wherein the substituent constant $\sigma_p^0$ of the electron attractive group is positive.

<3> The composition according to the above <2>, wherein the substituent constant $\sigma_p^0$ of the electron attractive group is 0.3 or more and 1 or less.

<4> The composition according to any one of the above <1> to <3>, wherein the polymerizable liquid crystal compound is a polymerizable smectic liquid crystal compound.

<5> The composition according to any one of the above <1> to <3>, the composition further comprising a polymerization initiator.

<6> A polarizing film comprising a compound represented by the following formula (1) and a polymer of a polymerizable liquid crystal compound:

[Chemical 5]

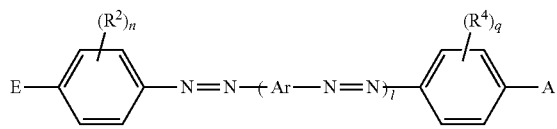

(1)

wherein E represents an electron attractive group having 3 or more carbon the following group:

[Chemical 6]

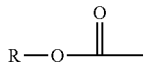

wherein R represents a hydrogen atom or a hydrocarbon group having 1 to 20 carbon atoms;

Ar represents a group selected from the following groups:

[Chemical 7]

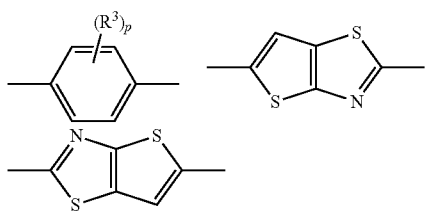

and A represents a group selected from the following groups:

[Chemical 8]

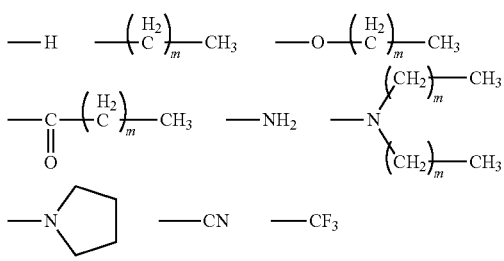

wherein $R^2$ through $R^4$, which are substituents other than a hydrogen atom, respectively represent an alkyl group having 1 to 4 carbon atoms, an alkoxy group having 1 to 4 carbon atoms, a halogen atom, or a cyano group, wherein one or more hydrogen atoms constituting the above alkyl group and alkoxy group may be substituted with a halogen atom or a hydroxy group, l denotes 1 or 2, m denotes an integer from 0 to 10 provided that when two m(s) are present in the same group, they may be the same or different, and n, p, and q respectively denote an integer from 0 to 2.

<7> The polarizing film according to the above <6>, wherein the substituent constant $\sigma_p^0$ of the electron attractive group is positive.

<8> The polarizing film according to the above <7>, wherein the substituent constant $\sigma_p^0$ of the electron attractive group is 0.3 or more and 1 or less.

<9> The polarizing film according to any one of the above <6> to <8>, wherein the polymer of the polymerizable liquid crystal compound exhibits a polymerizable smectic liquid crystal phase.

<10> The polarizing film according to any one of the above <6> to <9>, the polarizing film exhibiting a Bragg peak in X-ray diffraction measurement.

<11> A circularly polarizing plate comprising the polarizing film according to any one of the above <6> to <10>.

<12> A liquid crystal display device comprising the polarizing film according to any one of the above <6> to <10>.

<13> An organic electroluminescence display device comprising the circularly polarizing plate according to the above <11>.

The composition of the present invention produces the effect that a polarizing film can be formed which is reduced in decrease in absorbance in a condition where it is irradiated with light and has excellent light fastness. Also, the polarizing film of the present invention produces the effect that it is reduced in decrease in absorbance in a condition where it is irradiated with light and has excellent light fastness.

DETAILED DESCRIPTION OF THE PREFERRED EMBODIMENTS

An embodiment of the present invention will be explained in detail. It is to be noted in the captioned patent application that "A to B" means that "A or more and B or less".

Embodiment 1: Composition

A composition in the embodiment 1 of the present invention includes a compound represented by the following formula (1) (hereinafter also referred to as "compound (1)") and a polymerizable liquid crystal compound:

[Chemical 9]

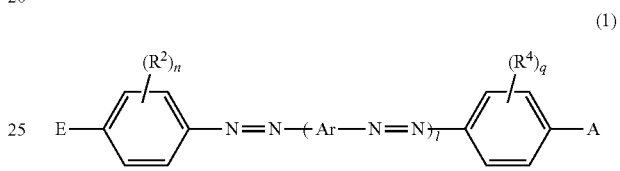

(1)

wherein E represents an electron attractive group having 3 or more carbon atoms or the following group (hereinafter also referred to as "substituent (X)"):

[Chemical 10]

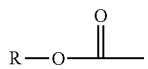

wherein R represents a hydrogen atom or a hydrocarbon group having 1 to 20 carbon atoms;

Ar represents a group selected from the following groups:

[Chemical 11]

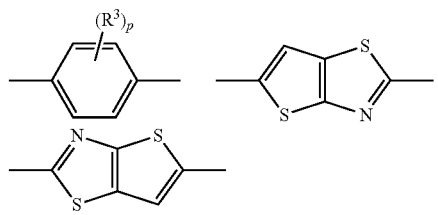

and A represents a group selected from the following groups:

[Chemical 8]

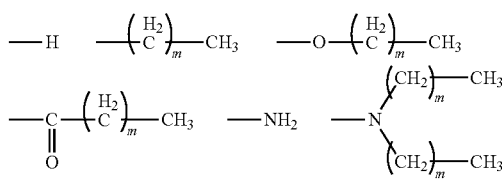

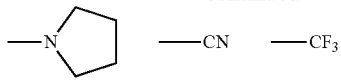 —CN —CF$_3$ wherein R$^2$ through R$^4$, which are substituents other than a hydrogen atom, respectively represent an alkyl group having 1 to 4 carbon atoms, an alkoxy group having 1 to 4 carbon atoms, a halogen atom, or a cyano group, wherein one or more hydrogen atoms constituting the above alkyl group and alkoxy group may be substituted with a halogen atom or a hydroxy group, l denotes 1 or 2. When l is 2, two Ar(s) existing in the formula (1) are a group selected from the groups mentioned above respectively, and they may be the same or different. m denotes an integer from 0 to 10 provided that when two m(s) are present in the same group, they may be the same or different, and n, p, and q respectively denote an integer from 0 to 2.

The composition of the present invention can form a polarizing film containing a compound (1) functioning as a dichroic dye by polymerizing the polymerizable liquid crystal compound in the composition.

<Dichroic Dye>

The compound (1) in the present invention functions as a dichroic dye and generally has an absorption peak in a wavelength range from 400 to 800 nm.

Positional isomerization of an azobenzene part of the compound (1) is preferably trans isomerization.

The above "E" in the compound (1) may be an electron attractive group having 3 or more carbon atoms. Here, the electron attractive group means a group that binds to a specific position of a molecule to reduce the electron density of the molecule. The substituent constant $\sigma_p^0$ of the electron attractive group, which constant is defined in Handbook of Chemistry, Elementary edition, Revised Fifth Edition II-379 to II-380 (edited by The Chemical Society of Japan, published from Maruzen Co., Ltd.), is preferably positive, more preferably in a range from 0.3 to 1, even more preferably in a range from 0.5 to 1, and even more preferably in a range from 0.7 to 1.

Also, the compound (1) in which "E" is an electron attractive group having 3 or more carbon atoms is superior in compatibility with the polymerizable liquid crystal compound to a compound which has the same structure as the compound (1) and in which "E" is an electron attractive group having less than 3 carbon atoms. Therefore, the compound (1) in which "E" is an electron attractive group having 3 or more carbon atoms is preferably contained in the composition and polarizing film of the present invention.

Examples of the electron attractive group having 3 or more carbon atoms include a fluoroalkyl group having 3 or more carbon atoms and a group represented by the following formula.

[Chemical 13]

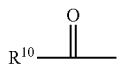

wherein R$^{10}$ represents a hydrocarbon group having 2 to 20 carbon atoms.

Examples of the fluoroalkyl group having 3 or more carbon atoms include the following group

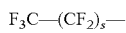 [Chemical 14]

wherein s denotes an integer from 2 to 20.

Examples of the hydrocarbon group having 2 to 20 carbon atoms in the compound (1) include linear or branched alkyl groups having no substituent such as an ethyl group, n-propyl group, isopropyl group, n-butyl group, isobutyl group, tert-butyl group, n-pentyl group, isopentyl group, neopentyl group, n-hexyl group, n-heptyl group, n-octyl group, n-nonyl group, and n-decyl group and aryl groups such as a phenyl group.

R$^2$ through R$^4$ in the compound (1) are respectively a substituent other than a hydrogen atom and respectively represent an alkyl group having 1 to 4 carbon atoms, alkoxy group having 1 to 4 carbon atoms, halogen atom, or cyano group. R$^2$ through R$^4$ may be bonded as substituents to any position of a phenylene group in the compound (1).

Examples of the alkyl group having 1 to 4 carbon atoms include linear or branched alkyl groups having no substituent such as a methyl group, ethyl group, n-propyl group, isopropyl group, n-butyl group, isobutyl group, and tert-butyl group.

One or more hydrogen atoms constituting such an alkyl group having 1 to 4 carbon atoms may be substituted with a halogen atom (for example, a fluorine atom) or hydroxy group. Examples of the alkyl group in which one or more hydrogen atoms are substituted with halogen atoms or the like include haloalkyl groups having 1 to 4 carbon atoms such as a fluoromethyl group, trifluoromethyl group, pentafluoroethyl group, and nonafluorobutyl group; and hydroxyalkyl groups having 1 to 4 carbon atoms such as a hydroxymethyl group, and 2-hydroxyethyl group.

Examples of the alkoxy group having 1 to 4 carbon atoms include linear or branched alkoxy groups having no substituent such as a methoxy group, ethoxy group, n-propoxy group, isopropoxy group, n-butoxy group, isobutoxy group, and tert-butoxy group.

One or more hydrogen atoms constituting such an alkoxy group having 1 to 4 carbon atoms may be substituted with a halogen atom (for example, a fluorine atom) or hydroxy group. Examples of the alkoxy group in which one or more hydrogen atoms are substituted with halogen atoms or the like include haloalkoxy groups having 1 to 4 carbon atoms such as a fluoromethoxy group, trifluoromethoxy group, pentafluoroethoxy group, and nonafluorobutoxy group; and hydroxyalkoxy groups having 1 to 4 carbon atoms such as a hydroxymethoxy group and 2-hydroxyethoxy group.

In the formula (1), n, p, and l respectively denote an integer from 0 to 2 and preferably 0.

Examples of the compound (1) in which "E" in the formula (1) is an electron attractive group having 3 or more carbon atoms include compounds represented by the following formulae (1-1) to (1-17).

[Chemical 15]
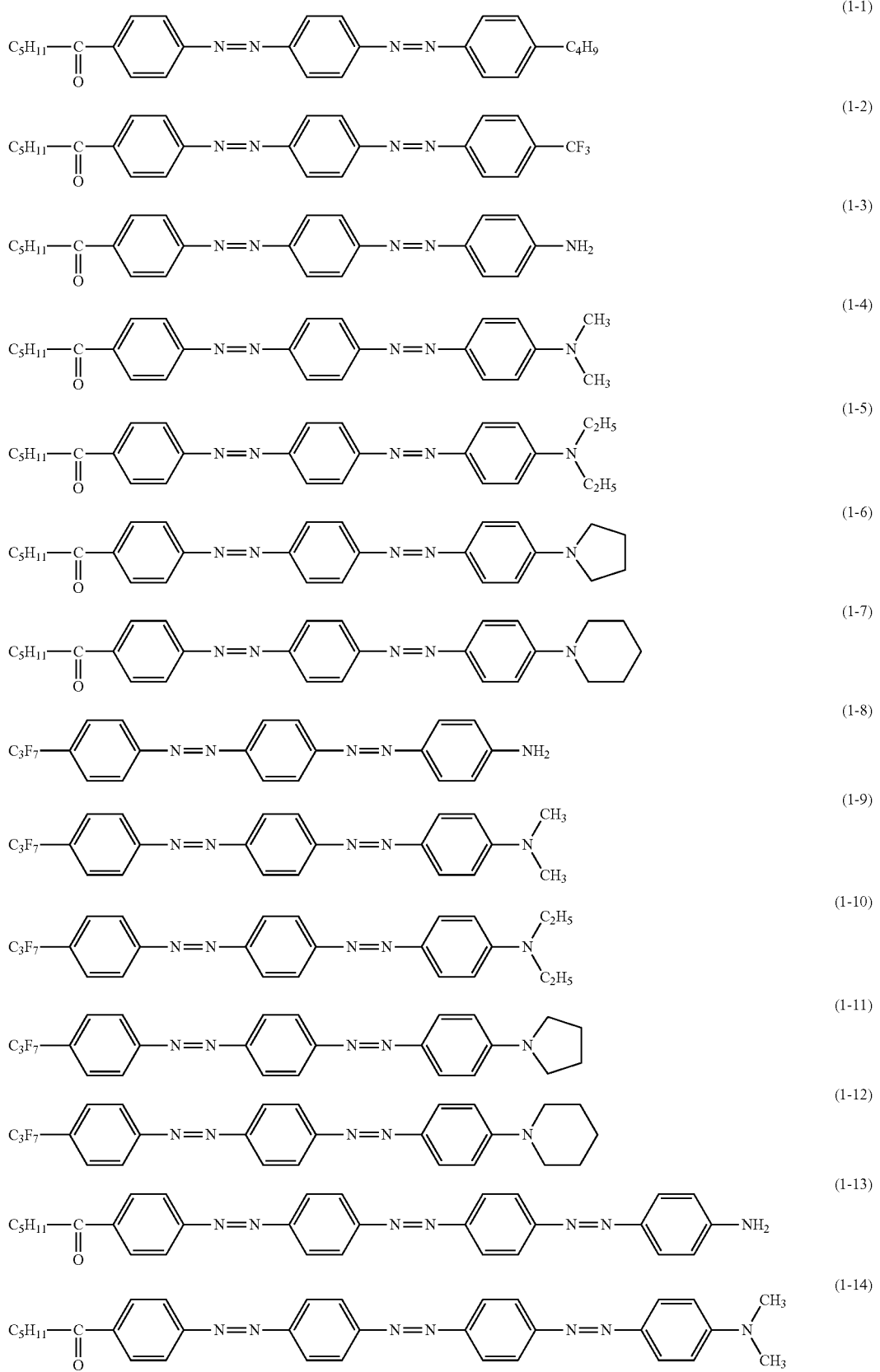

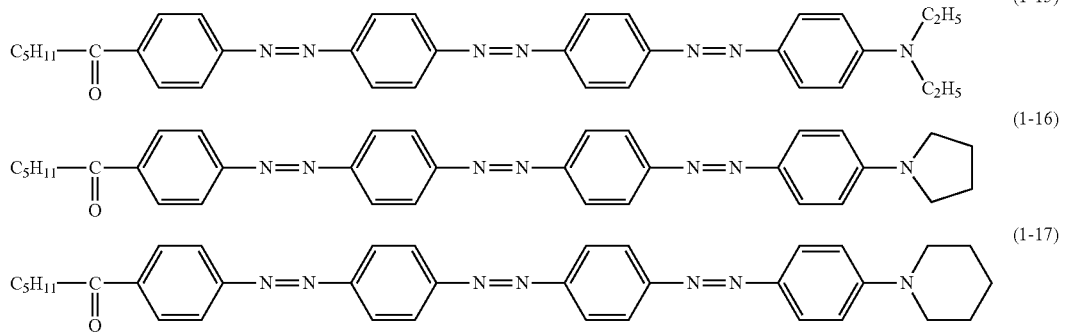

(1-15)
(1-16)
(1-17)

Among the examples of the compound (1) in which "E" in the formula (1) is an electron attractive group having 3 or more carbon atoms, compounds selected from compounds represented by the formulae (1-4), (1-5), and (1-6) are more preferable and compounds represented by the formula (1-4) are particularly preferable as the compound to be contained in the composition and polarizing film of the present invention.

"E" in the compound (1) may be the above substituent (X).

Examples of the hydrocarbon group having 1 to 20 carbon atoms in the compound (1) include linear or branched alkyl groups having no substituent such as a methyl group, ethyl group, n-propyl group, isopropyl group, n-butyl group, isobutyl group, tert-butyl group, n-pentyl group, isopentyl group, neopentyl group, n-hexyl group, n-heptyl group, n-octyl group, n-nonyl group, and n-decyl group and aryl groups such as a phenyl group.

When "E" in the compound (1) is the substituent (X), Ar, A, $R^2$ to $R^4$, l, m, n, p, and q in the compound (1) are the same as above.

Examples of the compound (1) in which "E" in the formula (1) is the substituent (X) include compounds represented by the following formulae (1-18) to (1-47).

[Chemical 16]

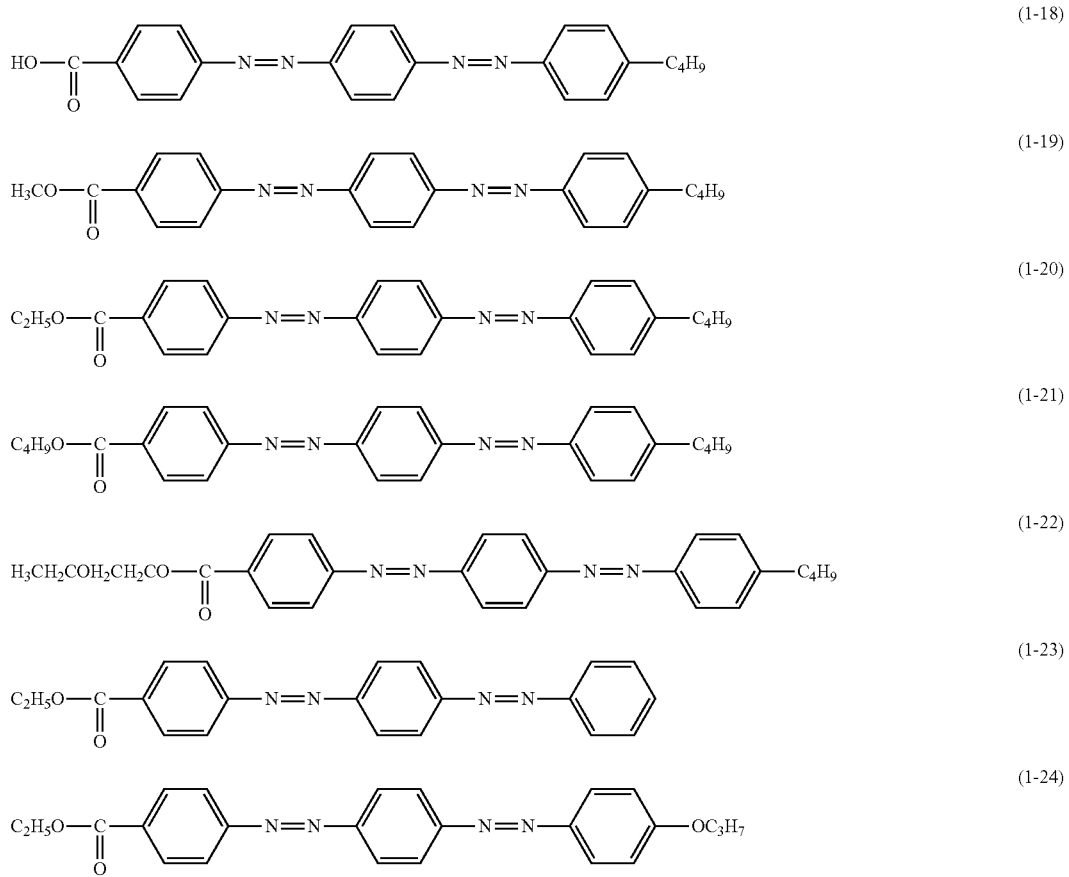

(1-18)
(1-19)
(1-20)
(1-21)
(1-22)
(1-23)
(1-24)

-continued
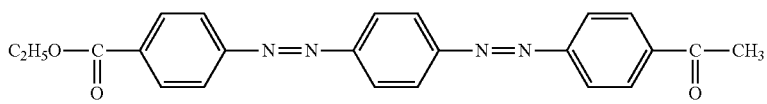
(1-25)
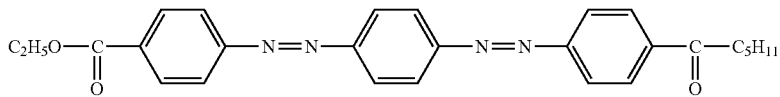
(1-26)
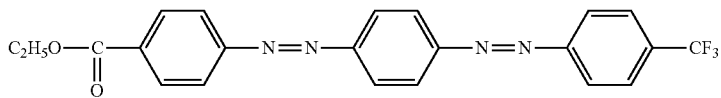
(1-27)
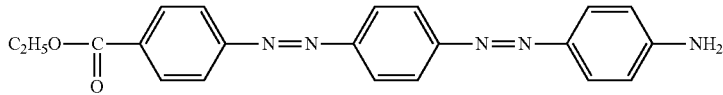
(1-28)
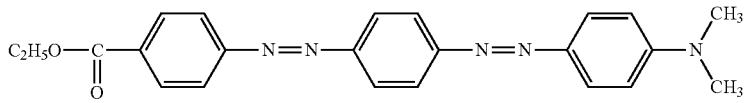
(1-29)
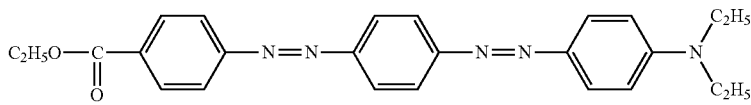
(1-30)
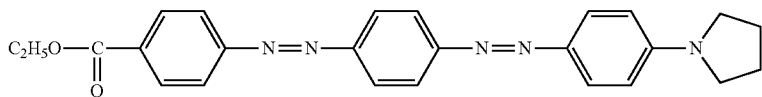
(1-31)
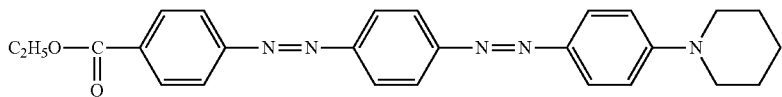
(1-32)
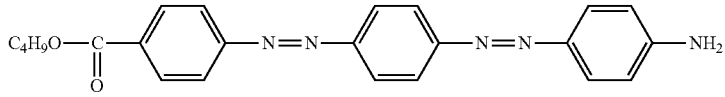
(1-33)
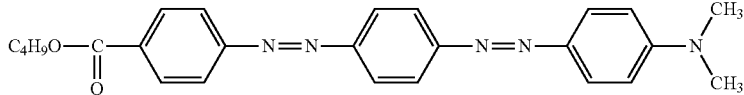
(1-34)
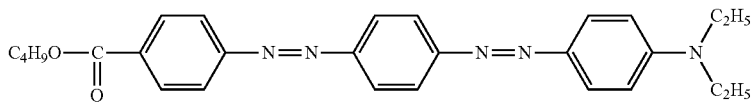
(1-35)
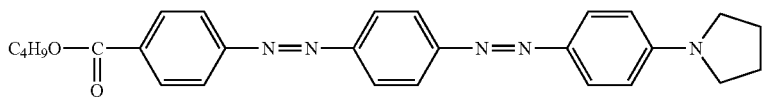
(1-36)
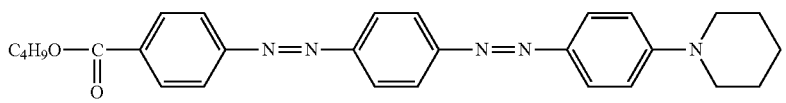
(1-37)
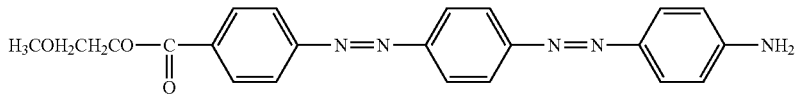
(1-38)

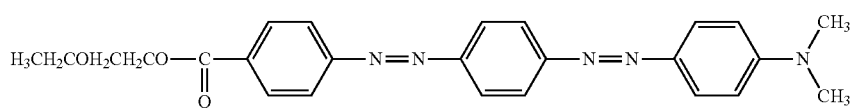
(I-39)

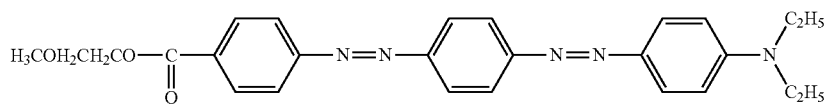
(I-40)

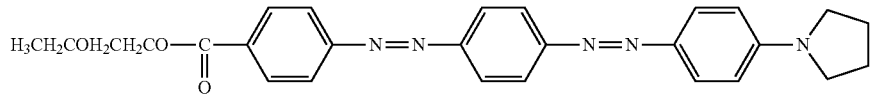
(I-41)

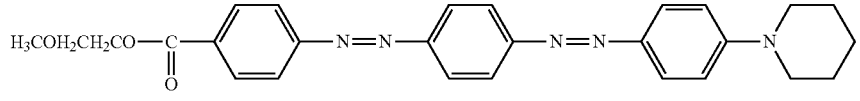
(I-42)

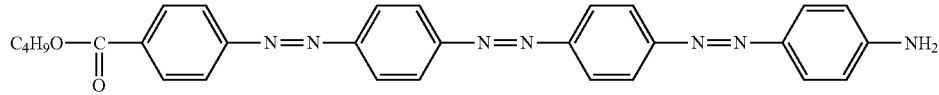
(1-43)

(1-44)

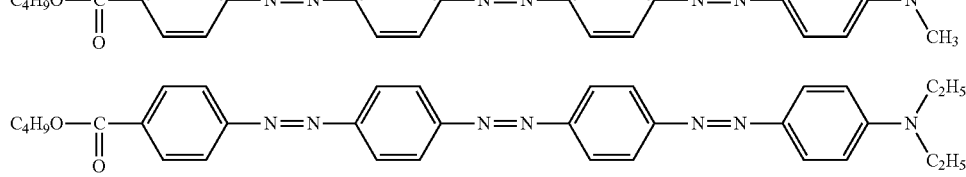
(1-45)

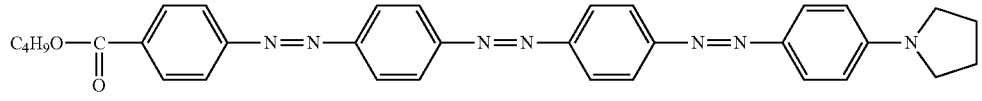
(1-46)

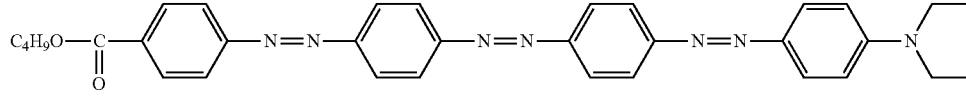
(1-47)

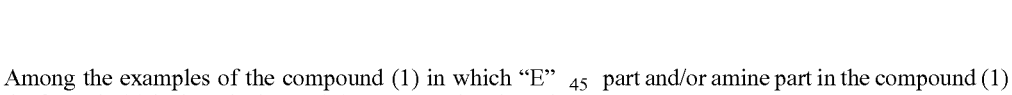

Among the examples of the compound (1) in which "E" in the formula (1) is the substituent (X), compounds selected from compounds represented by the formulae (1-29), (1-30), (1-31), (1-34), (1-35), (1-36), (1-39), (1-40), and (1-41) are more preferable and compounds represented by the formulae (1-29) and (1-30) are particularly preferable as the compound to be contained in the composition and polarizing film of the present invention.

Also, in the compound (1) in which "E" in the formula (1) is the substituent (X), the number of carbon atoms in an ester part and/or amine part in the compound (1) may be increased to improve solubility in a solvent contained in the composition of the present invention. Examples of the compound (1) in which "E" in the formula (1) is the substituent (X) and the number of carbon atoms in the above ester part and/or amine part is increased include compounds represented by the following formulae (1-48) to (1-85).

[Chemical 17]

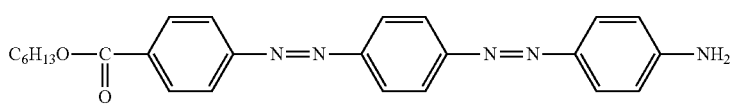
(1-48)

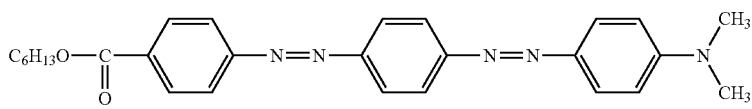
(1-49)

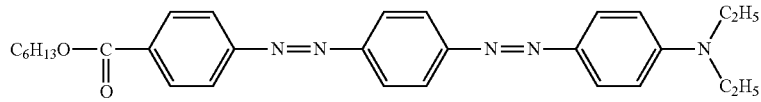 (1-50)
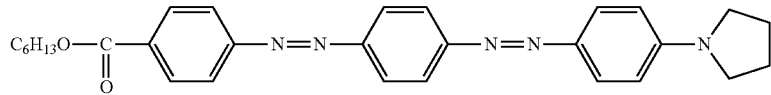 (1-51)
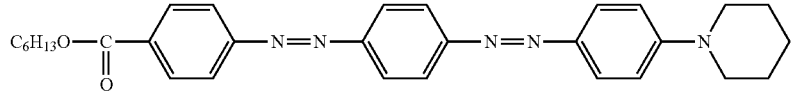 (1-52)
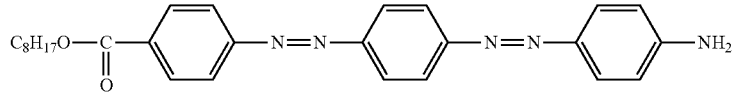 (1-53)
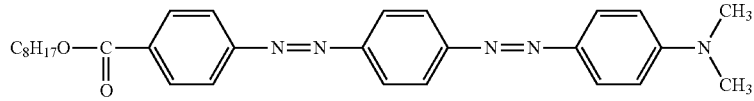 (1-54)
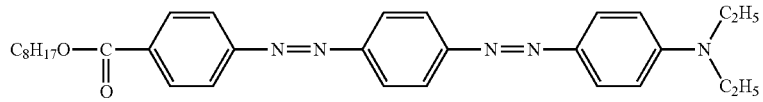 (1-55)
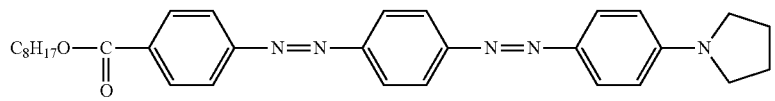 (1-56)
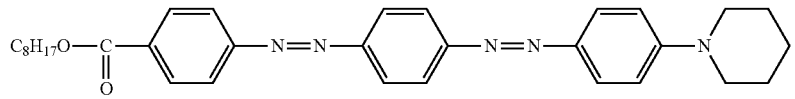 (1-57)
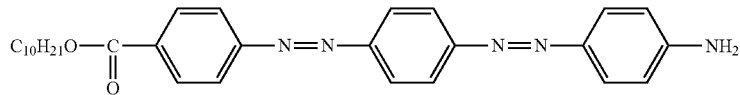 (1-58)
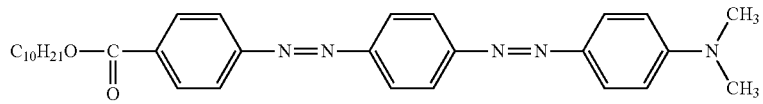 (1-59)
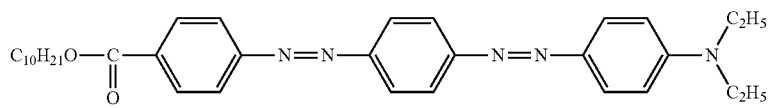 (1-60)
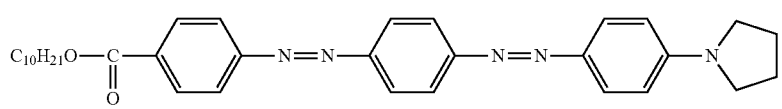 (1-61)
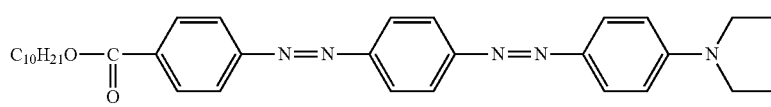 (1-62)
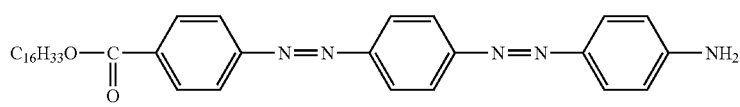 (1-63)

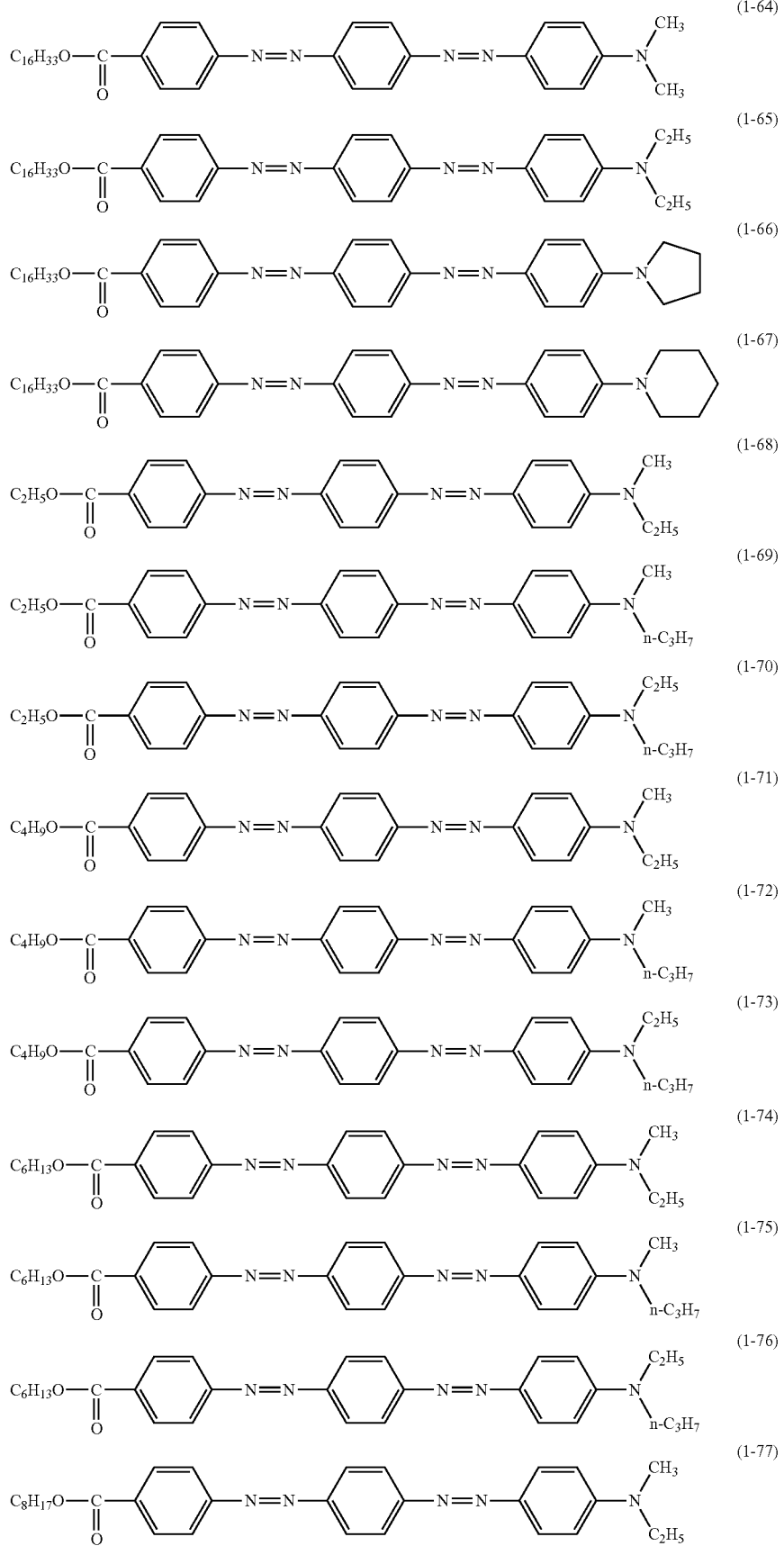

-continued

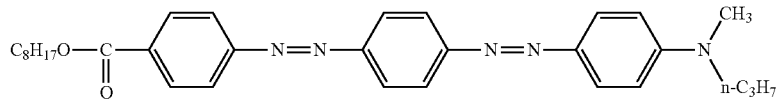
(1-78)

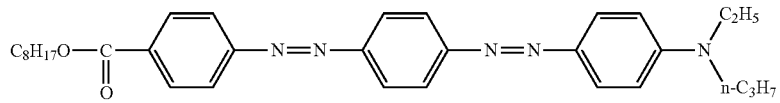
(1-79)

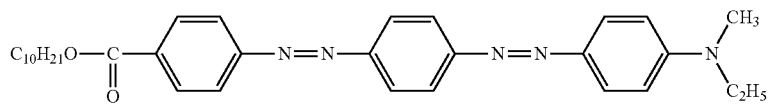
(1-80)

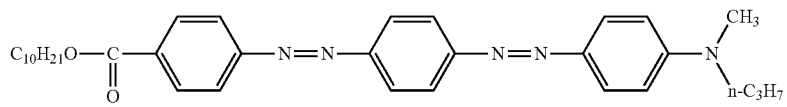
(1-81)

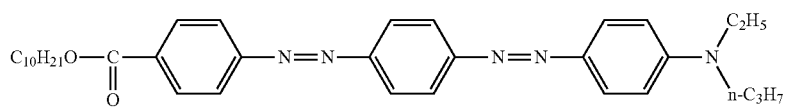
(1-82)

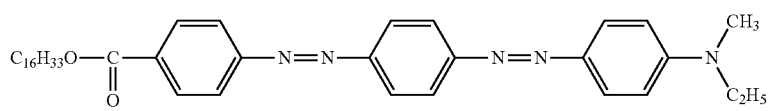
(1-83)

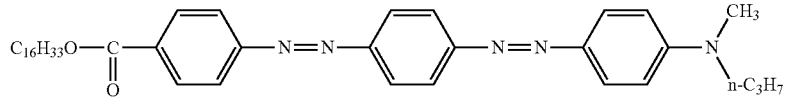
(1-84)

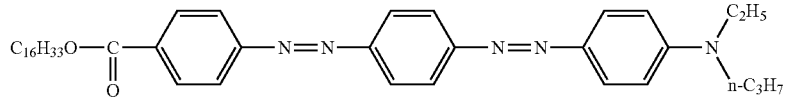
(1-85)

Moreover, in the compound (1) in which in the formula (1) is the substituent (X) and "A" is dialkylamine, the compounds (1) is which "A" is dimethylamine are more preferable than the compounds (1) in which is dialkylamine (for example, diethylamine) in the point that a polarizing film having a better dichroic ratio can be prepared. Examples of the compound (1) in which "E" in the formula (1) is the substituent (X) and "A" is dimethylamine include compounds represented by the following formulae (1-86) to (1-95).

[Chemical 18]

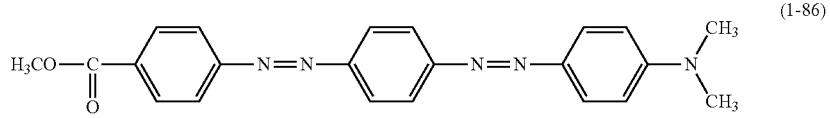
(1-86)

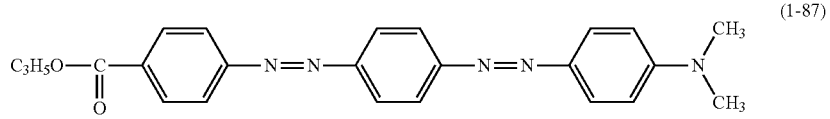
(1-87)

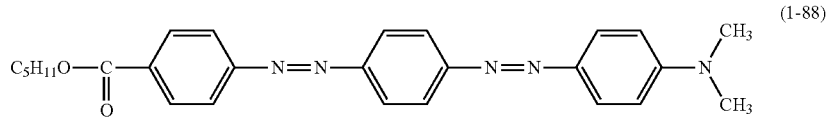
(1-88)

-continued

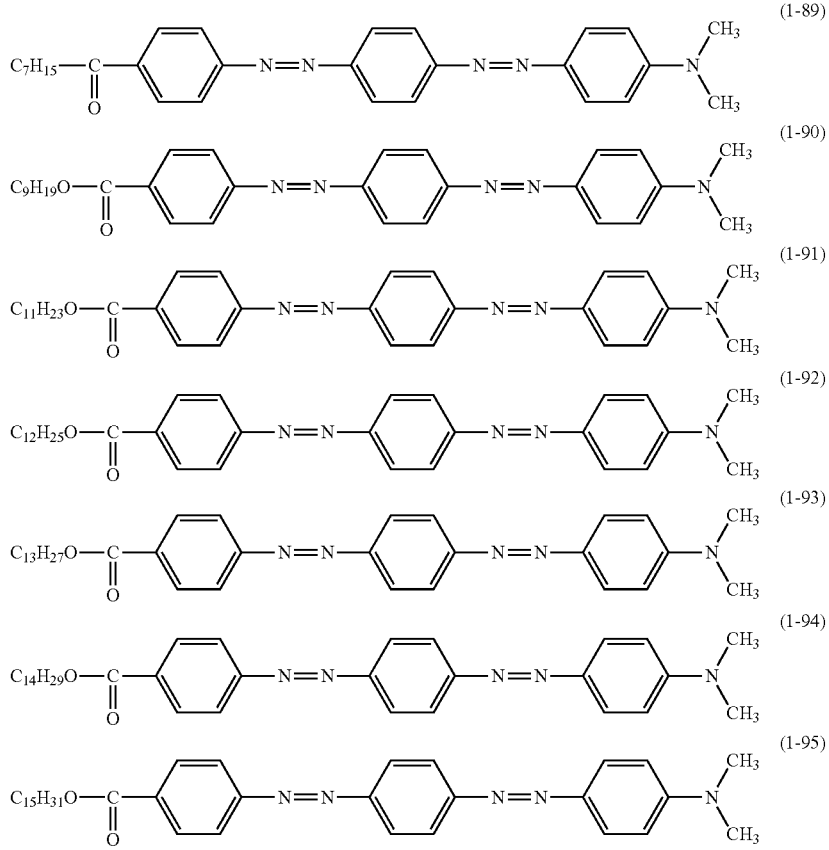

Ar in the formula (1) may be groups other than the phenyl group shown in the above. Examples of a group other than the phenyl group include a thienothiazole group. When Ar in the formula (1) is a thienothiazole group, it is preferred for the reason that λmax of a produced polarizing film shifts to the long-wavelength side. Examples of such compound include compounds represented by the following formulae (1-96) to (1-119).

[Chemical 19]

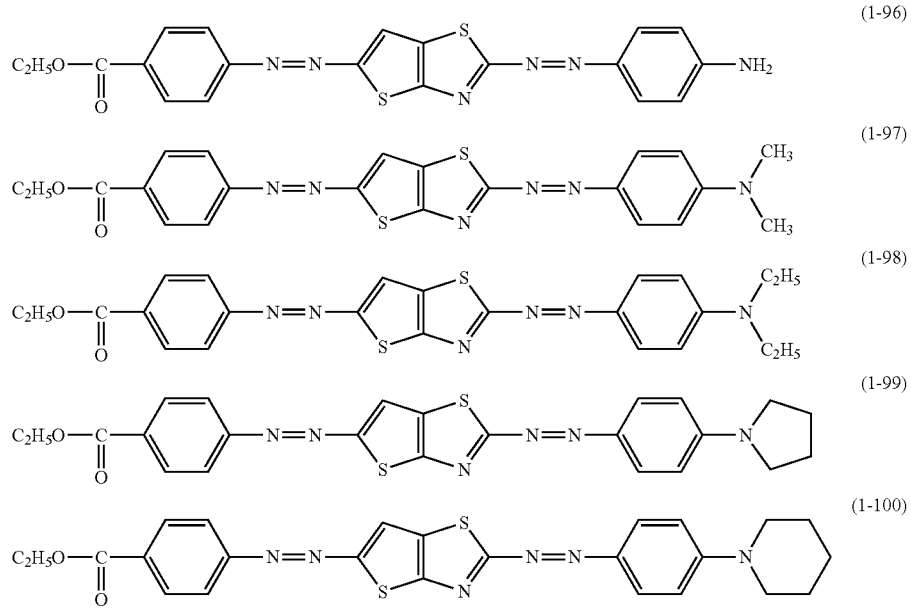

-continued
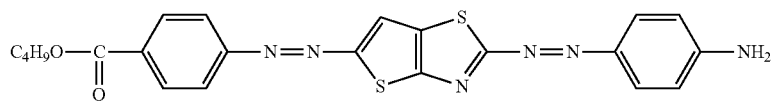
(1-101)
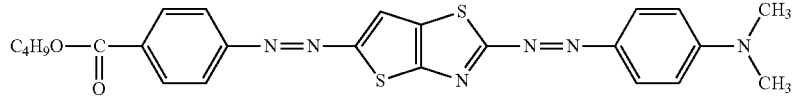
(1-102)
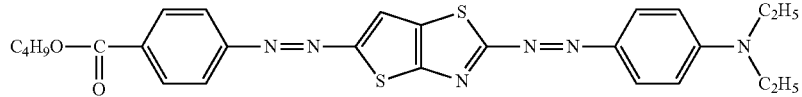
(1-103)
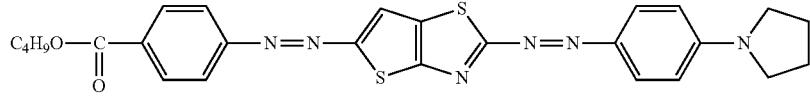
(1-104)
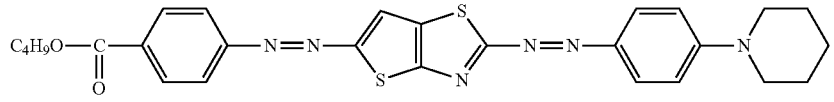
(1-105)
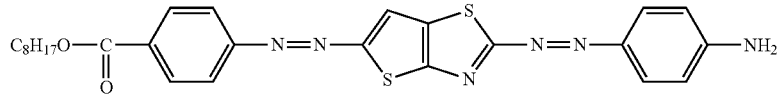
(1-106)
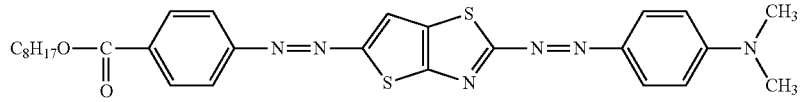
(1-107)
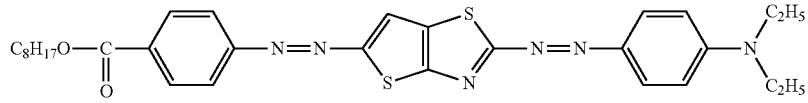
(1-108)
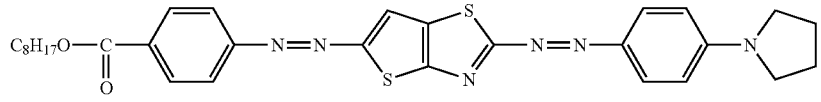
(1-109)
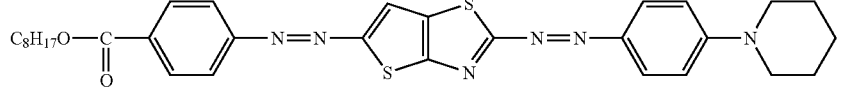
(1-110)
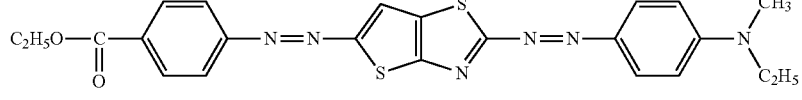
(1-111)
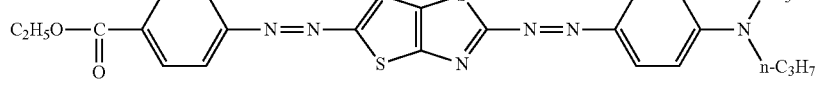
(1-112)
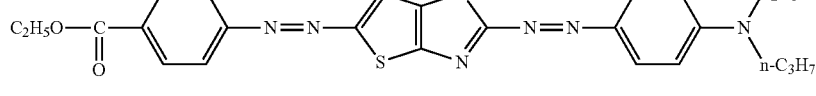
(1-113)
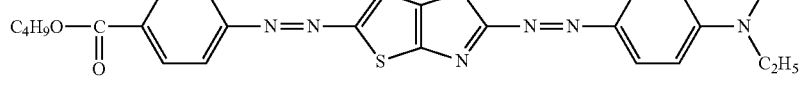
(1-114)

-continued

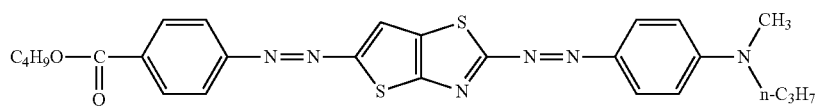
(1-115)

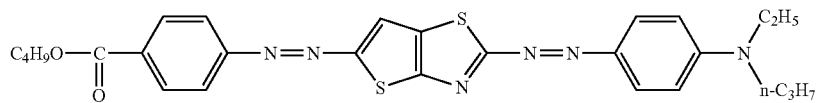
(1-116)

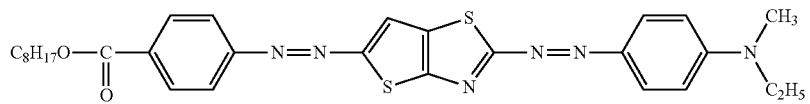
(1-117)

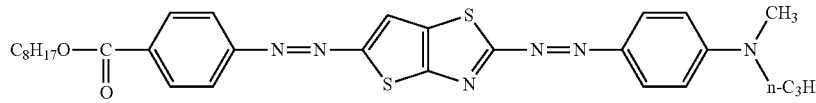
(1-118)

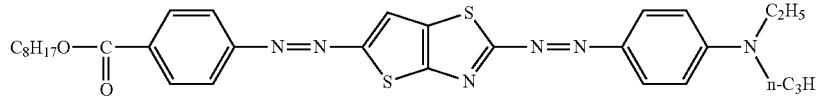
(1-119)

The compound (1) may be synthesized by a conventionally known synthetic method.

The content of the compound (1) in the composition of the present invention is preferably 50 parts by mass or less, more preferably 0.1 parts by mass or more and 20 parts by mass or less, and even more preferably 0.1 parts by mass or more and 10 parts by mass or less based on 100 parts by mass of the polymerizable liquid crystal compound which will be described later. It is preferable that the above content falls in the above range in the point that the orientation of the polymerizable liquid crystal compound in the composition is not disordered when the polymerizable liquid crystal compound in the composition is polymerized in the formation of a polarizing film using the composition of the present invention. As the compound (1) contained in the composition of the present invention, the compounds given as examples of the compound (1) may be used singly or in combinations of two or more. When a combination of two or more types is used as the compound (1), it is only required that the total amount of these compounds falls in the above range.

<Polymerizable Liquid Crystal Compound>

The polymerizable liquid crystal compound means a compound which has a polymerizable group in its molecule and can exhibit a liquid crystal phase by orientation and preferably a compound which can exhibit a liquid crystal phase by independent crystal orientation.

The polymerizable group means a group participating in polymerization reactions and is preferably a photo-polymerizable group. Here, the polymerizable group means a group which can participate in a polymerization reaction by an active radical, acid, and the like generated from a polymerization initiator which will be explained later. Examples of the polymerizable group include a vinyl group, vinyloxy group, 1-chlorovinyl group, isopropenyl group, 4-vinylphenyl group, acryloyloxy group, methacryloyloxy group, oxiranyl group, and oxetanyl group. Among these groups, an acryloyloxy group, methacryloyloxy group, vinyloxy group, oxiranyl group, and oxetanyl group are preferable and an acryloyloxy group is more preferable.

The polymerizable liquid crystal compound may be either a thermotropic liquid crystal type or a lyotropic liquid crystal type.

The polymerizable liquid crystal compound in the present invention is preferably a smectic liquid crystal compound exhibiting a smectic liquid crystal phase and more preferably a higher order smectic liquid crystal compound exhibiting a higher order smectic liquid crystal phase. The composition of the present invention which contains a polymerizable liquid crystal compound exhibiting a smectic liquid crystal phase can provide a polarizing film having more excellent polarizing performance. The composition of the present invention may contain two or more types of polymerizable liquid crystal compounds.

The compound (1) can exhibit high dichroic properties even in a condition where it is dispersed in dense intermolecular chains formed from the polymerizable liquid crystal compound exhibiting a smectic liquid crystal phase. Therefore, the composition of the present invention which contains the compound (1) may be used to form a polarizing film having a high dichroic ratio.

Examples of the higher order smectic liquid crystal phase include a smectic-B phase, smectic-D phase, smectic-E phase, smectic-F phase, smectic-G phase, smectic-H phase, smectic-I phase, smectic-J phase, smectic-K phase, and smectic-L phase. Among these phases, a smectic-B phase, smectic-F phase, and smectic-I phase are preferable and a smectic-B phase is more preferable. If the smectic liquid crystal phases exhibited by the polymerizable liquid crystal compound are these higher order smectic liquid crystal phases, a polarizing film having a higher orientational order is obtained. A polarizing film obtained from the composition containing a polymerizable liquid crystal compound exhibiting a higher order smectic liquid crystal phase having a high orientation order exhibits a Bragg peak derived from a higher order structure such as a hexatic phase or crystal phase in X-ray diffraction measurement. A Bragg peak means a peak specific to a periodic surface structure of molecular orientation. The periodic interval (order period) that a polarizing film obtained from the composition of the present invention has is preferably 0.30 to 0.50 nm.

The type of liquid crystal phase that the polymerizable liquid crystal compound exhibits can be confirmed by, for example, a method shown below. Specifically, an appropriate base material is prepared and a solution containing a polymerizable liquid crystal compound and a solvent is applied to the base material to form a coating film. Then, the base material is heat-treated or treated under reduced pressure to remove a solvent contained in the coating film. Then, a liquid crystal phase developed by gradually cooling the coating film after the coating film formed on the base material is heated to the isotropic phase temperature is inspected by texture observation using a polarization microspore, X-ray diffraction measurement, or differential scanning calorimetry. In this inspection, it can be confirmed that the film exhibits a nematic liquid crystal phase by cooling the film down to the first temperature and further a smectic liquid crystal phase by gradually cooling the film to the second temperature.

The polymerizable liquid crystal composition is preferably a compound represented by the formula (4) (hereinafter also referred to as "compound (4)").

$$U^1-V^1-W^1-X^1-Y^1-X^2-Y^2-X^3-W^2-V^2-U^2 \quad (4)$$

wherein $X^1$, $X^2$, and $X^3$ respectively represent a 1,4-phenylene group which may have a substituent or cyclohexane-1,4-diyl group which may have a substituent, provided that at least one of $X^1$, $X^2$, and $X^3$ is a 1,4-phenylene group which may have a substituent, —CH$_2$— constituting a cyclohexane-1,4-diyl group may be substituted with —O—, —S—, or —NR—, and R represents an alkyl group having 1 to 6 carbon atoms or phenyl group;

$Y^1$ and $Y^2$ respectively represent a single bond, —CH$_2$CH$_2$—, —CH$_2$O—, —COO—, —OCOO—, —N=N—, —CR$^a$=CR$^b$—, —C≡C—, or —C$^a$=N—. R$^a$ and R$^b$ respectively represent a hydrogen atom or an alkyl group having 1 to 4 carbon atoms;

$U^1$ represents a hydrogen atom or a polymerizable group;
$U^2$ represents a polymerizable group;
$W^1$ and $W^2$ respectively represent a single bond, —O—, —S—, —COO—, or —OCOO—; and
$V^1$ and $V^2$ respectively represent an alkanediyl group which may have a substituent and has 1 to 20 carbon atoms, wherein —CH$_2$— constituting the alkanediyl group may be substituted with —O—, —S—, or —NH—.

In the compound (4), at least one of $X^1$, $X^2$, and $X^3$ is preferably a 1,4-phenylene group which may have a substituent.

The 1,4-phenylene group which may have a substituent is preferably a 1,4-phenylene group having no substituent. The cyclohexane-1,4-diyl group which may have a substituent is preferably a trans-cyclohexane-1,4-diyl group which may have a substituent. The trans-cyclohexane-1,4-diyl group which may have a substituent is preferably a trans-cyclohexane-1,4-diyl group having no substituent. Examples of the substituent that is optionally contained in the 1,4-phenylene group which may have a substituent or cyclohexane-1,4-diyl group which may have a substituent include alkyl groups having 1 to 4 carbon atoms such as a methyl group, ethyl group, and n-butyl group, cyano group, and halogen atom.

$Y^1$ is preferably a single bond, —CH$_2$CH$_2$, or —COO and $Y^2$ is preferably —CH$_2$CH$_2$— or —CH$_2$O—.

$U^1$ is a hydrogen atom or a polymerizable group and preferably a polymerizable group. $U^2$ is a polymerizable group. It is preferable that $U^1$ and $U^2$ be both polymerizable groups and more preferably photo-polymerizable groups. A polymerizable liquid crystal compound having a photo-polymerizable group is advantageous in the point that it can be polymerized in lower-temperature conditions.

The polymerizable groups represented by $U^1$ and $U^2$ are preferably the same though they may be different from each other. Examples of the polymerizable group include a vinyl group, vinyloxy group, 1-chlorovinyl group, isopropenyl group, 4-vinylphenyl group, acryloyloxy group, methacryloyloxy group, oxiranyl group, and oxetanyl group. Among these groups, a vinyloxy group, acryloyloxy group, methacryloyloxy group, oxiranyl group, and oxetanyl group are preferable and an acryloyloxy group is more preferable.

Examples of the alkanediyl group represented by $V^1$ and include a methylene group, ethylene group, propane-1,3-diyl group, butane-1,3-diyl group, butane-1,4-diyl group, pentane-1,5-diyl group, hexane-1,6-diyl group, heptane-1,7-diyl group, octane-1,8-diyl group, decane-1,10-diyl group, tetradecane-1,14-diyl group, and icosane-1,20-diyl group. $V^1$ and $V^2$ are respectively preferably an alkanediyl group having 2 to 12 carbon atoms and more preferably an alkanediyl group having 6 to 12 carbon atoms.

Examples of the substituent optionally contained in the alkanediyl group having 1 to 20 carbon atoms include a cyano group and halogen atom. The alkanediyl group is preferably an alkanediyl group having no substituent and more preferably a linear alkanediyl group having no substituent.

$W^1$ and $W^2$ are respectively preferably a single bond or —O—.

Examples of the compound (4) include compounds represented by the following formulae (4-1) to (4-43). When the compound (4) has a cyolohexanediyl group, the cyclohexane-1,4-diyl group is preferably a trans type.

[Chemical 20]

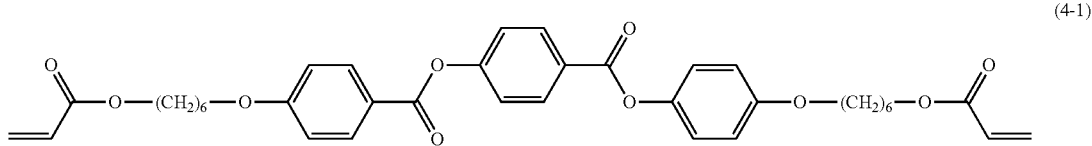

(4-1)

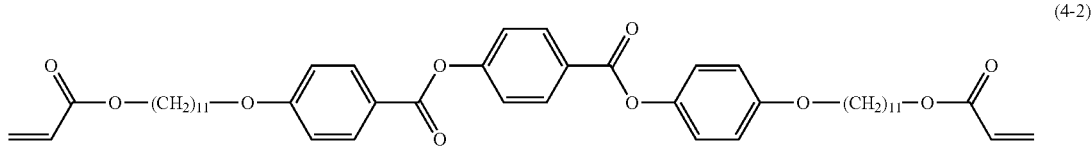

(4-2)

(4-3)
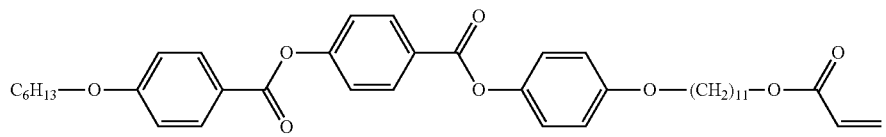
(4-4)
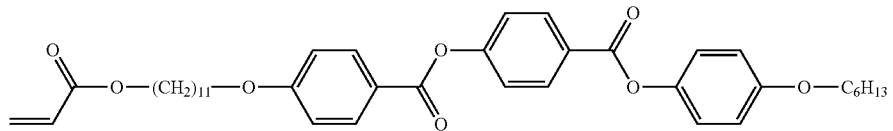
(4-5)
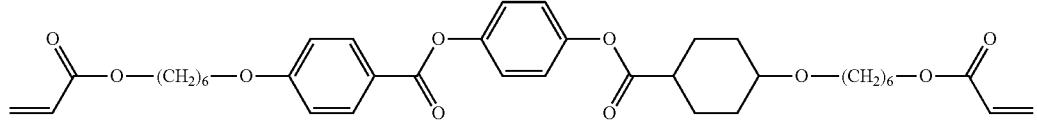
(4-6)
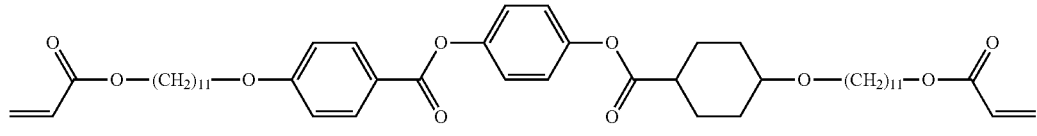
(4-7)
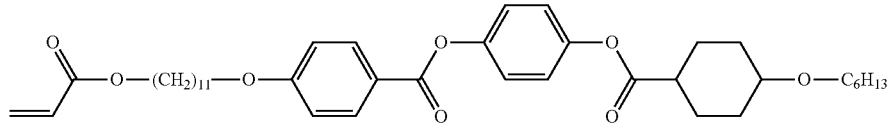
(4-8)
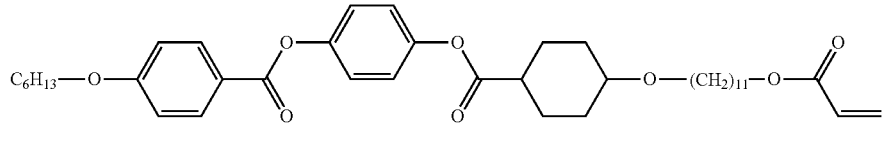
(4-9)
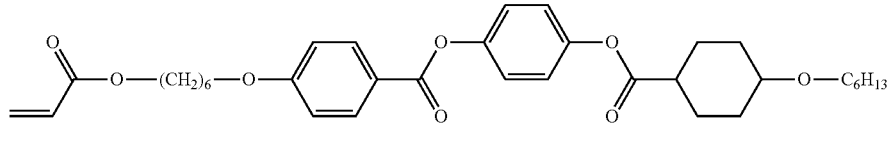
(4-10)
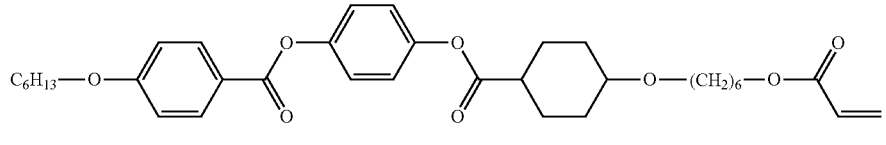
(4-11)
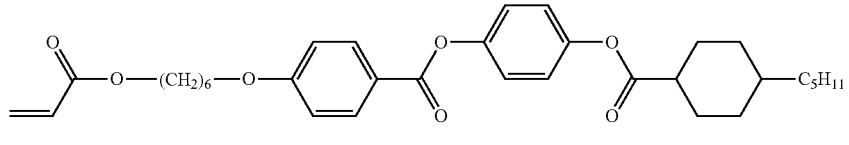
(4-12)
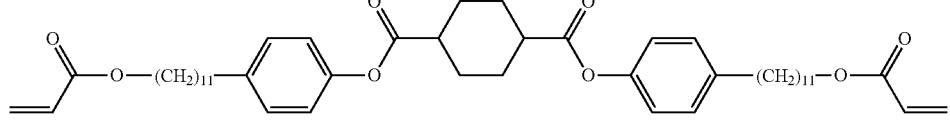
(4-13)
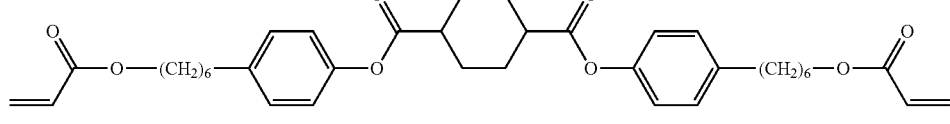

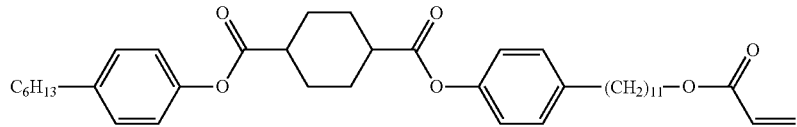
(4-14)
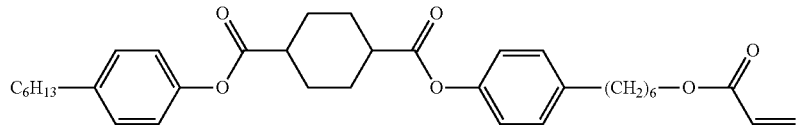
(4-15)
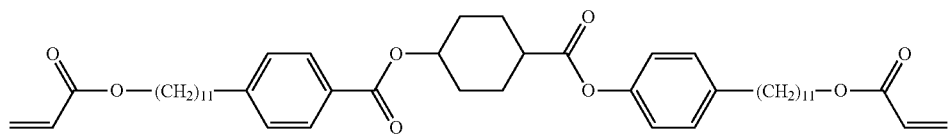
(4-16)
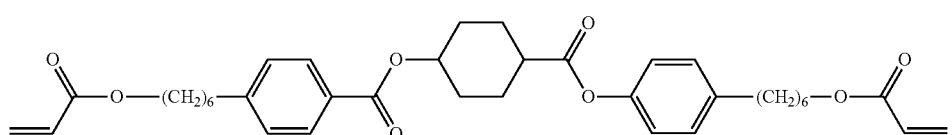
(4-17)
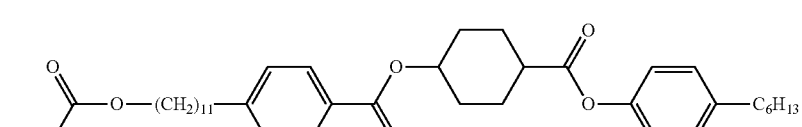
(4-18)
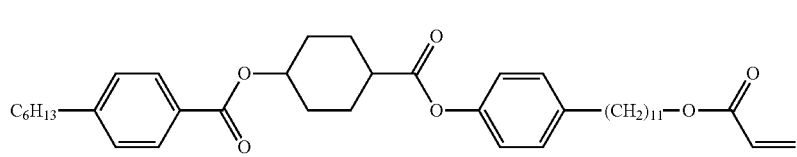
(4-19)
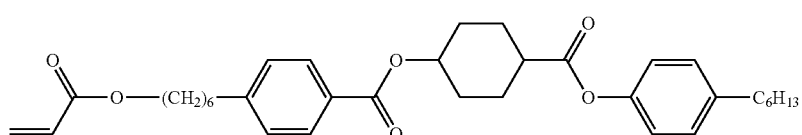
(4-20)
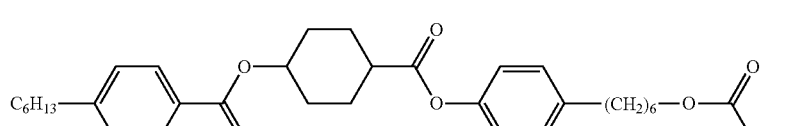
(4-21)
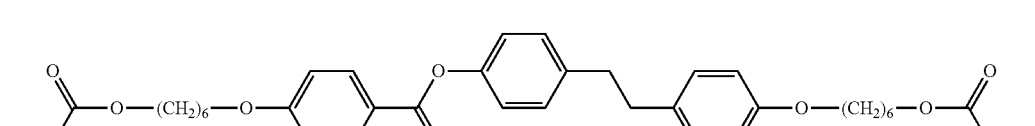
(4-22)
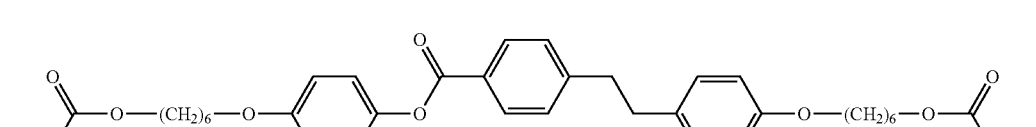
(4-23)
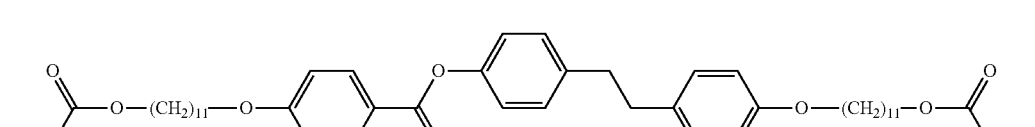
(4-24)

(4-25)
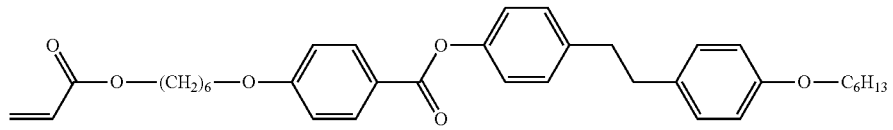
(4-26)
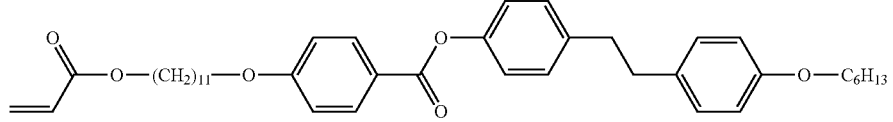
(4-27)
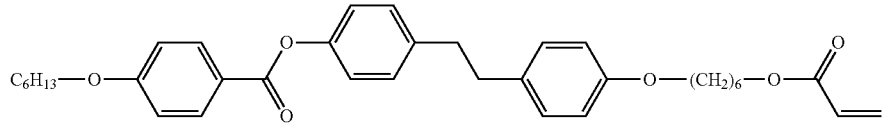
(4-28)
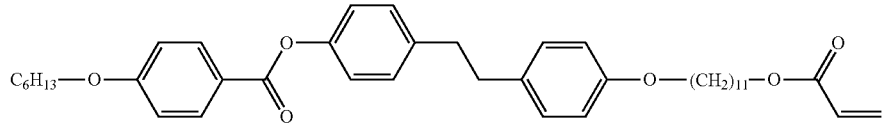
(4-29)
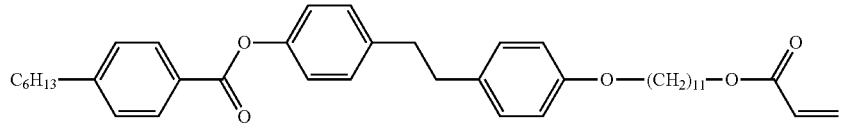
(4-30)
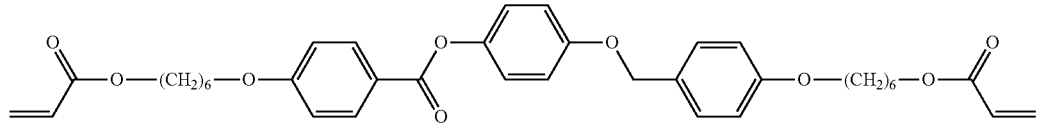
(4-31)
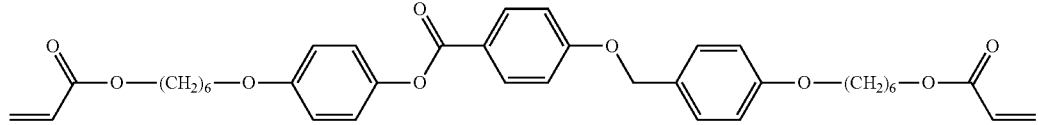
(4-32)
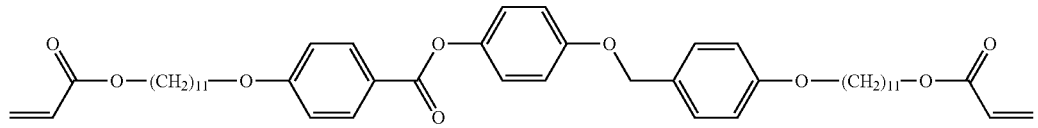
(4-33)
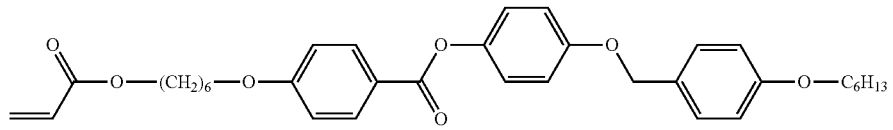
(4-34)
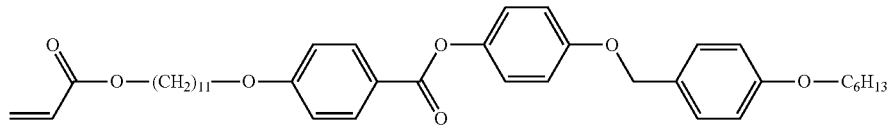
(4-35)
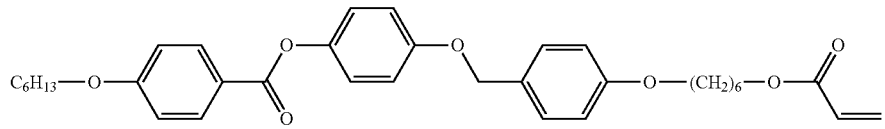

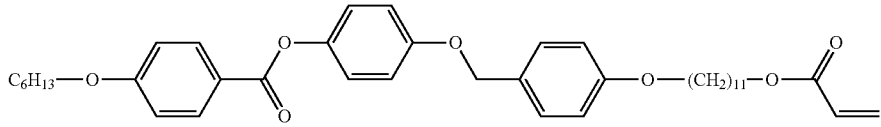

(4-36)

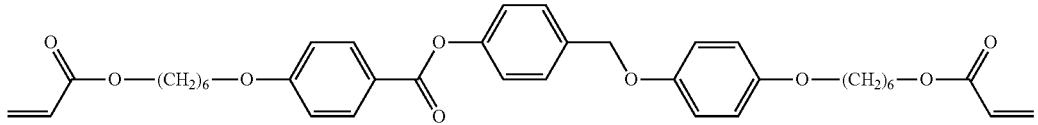

(4-37)

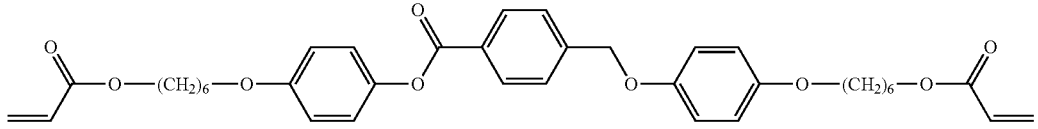

(4-38)

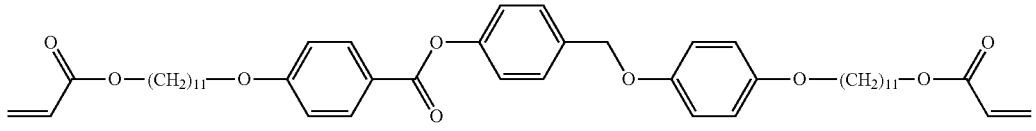

(4-39)

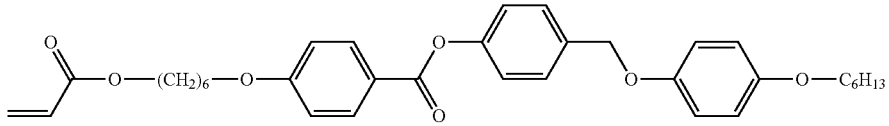

(4-40)

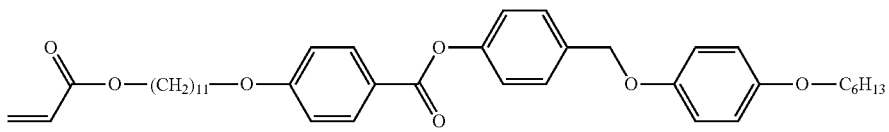

(4-41)

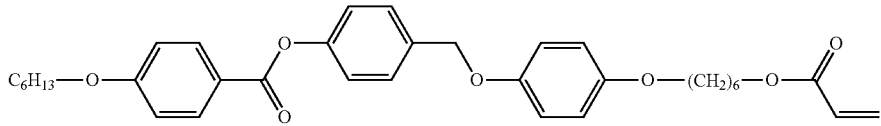

(4-42)

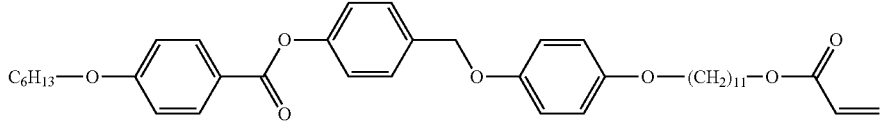

(4-43)

Among the aforementioned examples of the polymerizable liquid crystal compound, at least one type of compound (4) selected from the group consisting of compounds represented by the formulae (4-5), (4-6), (4-7), (4-8), (4-9), (4-10), (4-11), (4-12), (4-13), (4-14), (4-15), (4-22), (4-24), (4-25), (4-26), (4-27), (4-28), and (4-29) is preferable.

The composition of the present invention may contain two or more types of compounds (4). When two or more types of polymerizable liquid crystal compounds are combined, it is preferable that at least one type among these types be the compound (4) and it is more preferable that two or more types among these types be the compounds (4). A combination of two or more types of polymerizable liquid crystal compounds, though depending on the situation, ensures that a liquid crystal phase can be kept temporarily even at a temperature less than the liquid crystal-liquid crystal phase transition temperature. When two types of polymerizable liquid crystal compounds are combined, the ratio of these compounds to be mixed is generally 1:99 to 50:50, preferably 5:95 to 50:50, and more preferably 10:90 to 50:50.

The compound (4) may be produced by a method described in known documents such as Lub et al. Recl. Trav. Chim. Pays-Bas, 115, 321-328 (1996) and JP No. 4719156.

The ratio of the polymerizable liquid crystal compound to be contained in the composition of the present invention is preferably 70 to 99.5 parts by mass, more preferably 80 to 99 parts by mass, even more preferably 80 to 94 parts by mass, and particularly preferably 80 to 90 parts by mass based on 100 parts by mass of the solid content of the composition of the present invention from the viewpoint of improving the orientation of the polymerizable liquid crystals. Here, the solid content means the total amount of the components other than solvents in the composition of the present invention.

The content of the compound (1) in the composition of the present invention is generally 50 parts by mass or less, and preferably 0.1 parts by mass or more and 10 parts by mass or less, and more preferably 0.1 parts by mass or more and 5 parts by mass or less based on 100 parts by mass of the polymerizable liquid crystal compound. When the content of the compound (1) is 50 parts by mass or less based on 100 parts by mass of the polymerizable liquid crystal compound, there is a tendency that a polarizing film reduced in disorder of the orientation of the polymerizable liquid crystal compound and compound (1) can be obtained.

The composition of the present invention preferably contains a polymerization initiator and a solvent and further, a photosensitizer, polymerization inhibitor, and leveling agent.

<Polymerization Initiator>

The polymerization initiator is a compound capable of initiating a polymerization reaction of a polymerizable liquid crystal compound. A photo-polymerization initiator generating active radials by the action of light is preferable as the polymerization initiator.

Examples of the polymerization initiator include a benzoin compound, benzophenone compound, alkyl phenone compound, acylphosphine oxide compound, triazine compound, iodonium salt, and sulfonium salt.

Examples of the benzoin compound include benzoin, benzoin methyl ether, benzoin ethyl ether, benzoin isopropyl ether, and benzoin isobutyl ether.

Examples of the benzophenone compound include benzophenone, methyl o-benzoylsuccinate, 4-phenylbenzophenone, 4-benzoyl-4'-methyldiphenyl sulfide, 3,3',4,4'-tetra(tert-butylperoxycarbonyl)benzophenone, and 2,4,6-trimethylbenzophenone.

Examples of the alkyl phenone compound include diethoxyacetophenone, 2-methyl-2-morpholino-1-(4-methylthiophenyl)propan-1-one, 2-benzyl-2-dimethylamino-1-(4-morpholinophenyl)butan-1-one, 2-hydroxy-2-methyl-1-phenylpropan-1-one, 1,2-diphenyl-2,2-dimethoxyethan-1-one, 2-hydroxy-2-methyl-1-[4-(2-hydroxyethoxy)phenyl]propan-1-one, 1-hydroxycyclohexyl phenyl ketone, and oligomer of 2-hydroxy-2-methyl-1-[4-(1-methylvinyl)phenyl]propan-1-one.

Examples of the acylphosphine oxide compound include 2,4,6-trimethylbenzoyldiphenylphosphine oxide and bis(2,4,6-trimethylbenzoyl)phenylphosphine oxide.

Examples of the triazine compound include 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-(4-methoxystyryl)-1,3,5-triazine, 2,4-bis(trichloromethyl)-6-[2-(5-methylfuran-2-yl)ethenyl]1,3,5-triazine, 2,4-bis(trichloromethyl)-6-[2-(furan-2-yl)ethenyl]1,3,5-triazine, 2,4-bis(trichloromethyl)-6-[2-(4-diethylamino-2-methylphenyl)ethenyl]1,3,5-triazine, and 2,4-bis(trichloromethyl)-6-[2-(3,4-dimethoxyphenyl)ethenyl]1,3,5-triazine.

Examples of the iodonium salt and sulfonium salt include salts represented by the following formula.

[Chemical 21]

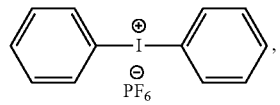

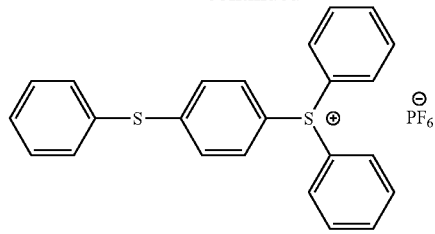

The polymerization initiators may be used singly or in combinations of two or more.

As the polymerization initiator, commercially available products may be used. Examples of the commercially available polymerization initiator include Irgacure (trademark) 907, 184, 651, 819, 250, and 369 (manufactured by Ciba Specialty Chemicals Co., Ltd.); SEIKUOL (trademark) BZ, Z, and BEE (manufactured by Seiko Chemical Co., Ltd.); Kayacure (trademark) BP100 and UVI-6992 (manufactured by The Dow Chemical Company); Adeka Optomer SP-152 and SP-170 (manufactured by ADEKA CORPORATION); TAZ-A and TAZ-PP (manufactured by DKSH Japan K.K.), and TAZ-104 (manufactured by Sanwa Chemical Co., Ltd.).

When the composition of the present invention contains a polymerization initiator, the content of the polymerization initiator in the composition of the present invention is generally 0.1 to 30 parts by mass, preferably 0.5 to 10 parts by mass, and more preferably 0.5 to 8 parts by mass based on 100 parts by mass of the polymerizable liquid crystal compound from the viewpoint of resistance to the disorder of orientation of the polymerizable liquid crystal compound.

<Solvent>

The solvent is preferably a solvent capable of perfectly dissolving the polymerizable liquid crystal compound and compound (1). Also, the solvent is preferably a solvent inert to the polymerization reaction of the polymerizable liquid crystal compound.

Examples of the solvent include alcohol solvents such as methanol, ethanol, ethylene glycol, isopropyl alcohol, propylene glycol, ethylene glycol methyl ether, ethylene glycol butyl ether, and propylene glycol monomethyl ether; ester solvents such as ethyl acetate, butyl acetate, ethylene glycol methyl ether acetate, γ-butyrolactone, propylene glycol methyl ether acetate, and ethyl lactate; ketone solvents such as acetone, methyl ethyl ketone, cyclopentanone, cyclohexanone, 2-heptanone, and methyl isobutyl ketone; aliphatic hydrocarbon solvents such as pentane, hexane, and heptane; aromatic hydrocarbon solvents such as toluene and xylene; nitrile solvents such as acetonitrile; ether solvents such as tetrahydrofuran and dimethoxyethane; and chlorine-containing solvents such as chloroform and chlorobenzene. These solvents may be used singly or in combinations of two or more.

The content of the solvent in 100 parts by mass of the composition is preferably 50 parts by mass to 98 parts by mass. Therefore, the solid content in 100 parts by mass of the composition is preferably 2 parts by mass to 50 parts by mass. When the solid content of the composition is 50 parts by mass or less, there is a tendency for a polarizing film to have almost uniform thickness and resistance to the formation of an irregular polarizing film. The above solid content may be properly determined in consideration of the thickness of a polarizing film to be produced.

<Sensitizer>

The use of a sensitizer more promotes the polymerization reaction of the polymerizable liquid crystal compound.

As the sensitizer, a photosensitizer is preferable particularly when a photo-polymerization initiator is contained in the composition of the present invention. Examples of the sensitizer include xanthone compounds such as xanthone and thioxanthone (for example, 2,4-diethylthioxanthone and 2-isopropylthioxanthone); anthracene compounds such as anthracene and alkoxy group-containing anthracene (for example, dibutoxy anthracene); phenothiazine, and rubrene.

The content of the sensitizer in the composition is preferably 0.1 parts by mass to 30 parts by mass, more preferably 0.5 parts by mass to 10 parts by mass, and 0.5 parts by mass to 8 parts by mass based on 100 parts by mass of the total amount of at least two polymerizable liquid crystal compounds.

<Polymerization Inhibitor>

The degree of progress of the polymerization reaction of the polymerizable liquid crystal compound can be controlled by using a polymerization inhibitor.

Examples of the polymerization inhibitor include radical scavengers, for example, phenol type compounds such as 2,6-di-tert-butyl-4-methylphenol, sulfur type compounds such as dilauryl thiodipropionate, phosphorus compounds such as trioctyl phosphite, and amine compounds containing a hindered amine structure represented by 2,2,6,6-tetramethylpiperidine.

A phenol type compound is preferable as the polymerization inhibitor in the point that a polarizing film which is a liquid crystal cured film is reduced in coloration of the polarizing film which is a liquid crystal cured film.

The content of the polymerization inhibitor in the composition is preferably 0.1 parts by mass to 30 parts by mass, more preferably 0.5 parts by mass to 10 parts by mass, and even more preferably 0.5 parts by mass to 8 parts by mass based on 100 parts by mass of the total amount of at least two polymerizable liquid crystal compounds. When the content of the polymerization inhibitor is within the above range, polymerization can be finished without any disorder of the orientation of the polymerizable liquid crystal compound. These polymerization inhibitors may be used either singly or in combinations of too or more.

<Leveling Agent>

The leveling agent is an additive having the functions of controlling the fluidity of the composition and more flattening a film obtained by application of the composition, and examples of the leveling agent include surfactants. Preferable examples of the leveling agent include leveling agents using, as its major component, a polyacrylate compound, such as "BYK-361N" (manufactured by BYK Chemie Company) and leveling agents using, as its major component, a fluorine atom-containing compound such as Serflon (trademark) "S-381" (manufactured by AGC SEIMI CHEMICAL CO., LTD.).

Embodiment 2: Polarizing Film

A polarizing film according to the embodiment 2 of the present invention includes a compound represented by the following formula (1) and a polymer of a polymerizable liquid crystal compound:

[Chemical 22]

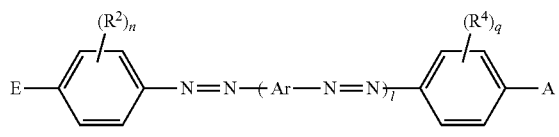

(1)

wherein E represents an electron attractive group having 3 or more carbon atoms or the following group (hereinafter also referred to as "substituent (X)"):

[Chemical 23]

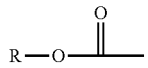

wherein R represents a hydrogen atom or a hydrocarbon group having 1 to 20 carbon atoms;
Ar represents a group selected from the following groups:

[Chemical 24]

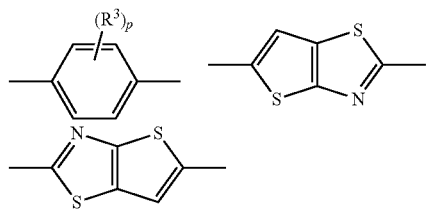

and A represents a group selected from the following groups:

[Chemical 25]

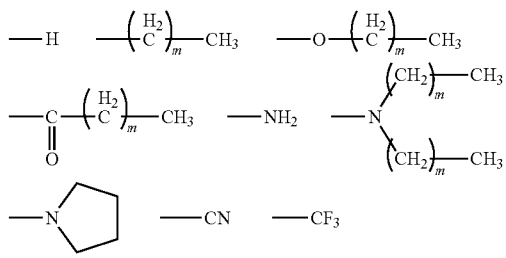

wherein $R^2$ through $R^4$, which are substituents other than a hydrogen atom, respectively represent an alkyl group having 1 to 4 carbon atoms, an alkoxy group having 1 to 4 carbon atoms, a halogen atom, or a cyano group, wherein one or more hydrogen atoms constituting the above alkyl group and alkoxy group may be substituted with a halogen atom or a hydroxy group, l denotes 1 or 2, m denotes an integer from 0 to 10 provided that when two m(s) are present in the same group, they may be the same or different, and n, p, and q respectively denote an integer from 0 to 2.

The polarizing film according to the embodiment 2 of the present invention can be made from a liquid crystal cured film produced by using a composition according to the embodiment 1 of the present invention and by polymerizing a polymerizable liquid crystal compound in the composition. In other words, the polarizing film according to the embodiment 2 of the present invention can be formed from the composition according to the embodiment 1 of the present invention. Specifically, the polarizing film of the present invention can be usually obtained by applying the composition of the present invention which contains a polymerizable liquid crystal compound onto an oriented film formed on a substrate or base material.

The polarizing film of the present invention usually has a structure in which a polymer produced by polymerizing the above polymerizable liquid crystal compound is integrated into a film form and the compound (1) is dispersed in the polymer. Also, the compound (1) dispersed in the polymer is oriented in one direction.

Furthermore, in the above polymer, monomer units constituting the polymer are oriented to exhibit a smectic phase. In other words, the above polymer usually has a structure in which the above monomers are polymerized with each other in a condition where they are oriented to exhibit a smectic phase.

Specifically, in the polarizing film of the present invention, the compound (1) is oriented in the polymer oriented in the state of a smectic phase.

The polarizing film of the present invention is usually a film 5 μm or less in thickness which is cured in a condition where the polymerizable liquid crystal compound is oriented and is preferably a cured liquid crystal film in which the polymerizable liquid crystal compound is cured in a condition where the polymerizable liquid crystal compound is oriented in a direction parallel or perpendicular to the surface of the base material.

The thickness of the polarizing film of the present invention is preferably 0.3 μm to 5 μm and more preferably 1 μm to 3 μm. The thickness of the polarizing film can be measured by an interference thickness meter, laser microscope, or contact-type thickness meter.

The composition (1) that is contained in the polarizing film of the present invention and functions as a dichroic dye has an electron attractive group having 3 or more carbon atoms or a substituent (X) at its one terminal (corresponds to "E" in the formula (1)), whereby oxidation caused by irradiation with light can be limited and therefore, the dichroic dye is resistant to deterioration. Accordingly, the polarizing film of the present invention which contains the compound (1) has excellent light fastness. The polarizing film of the present invention can be more limited in decrease in absorbance with time in contrast with conventional polarizing films even if used under sunlight.

<Base Material>

Examples of the base material include glass materials and plastic materials, plastic materials being preferable. Examples of a plastic constituting the plastic materials include polyolefin such as polyethylene, polypropylene, and norbornene type polymer; cyclic olefin type resin; polyvinyl alcohol; polyethylene terephthalate; polymethacrylate; polyacrylate; cellulose ester such as triacetyl cellulose, diacetyl cellulose, and cellulose acetate propionate; polyethylene naphthalate; polycarbonate; polysulfone; polyether sulfone; polyether ketone; polyphenylene sulfide and polyphenylene oxide.

Examples of commercially available cellulose ester materials include "FUJITAC FILM" (manufactured by Fujifilm Corporation); "KC8UX2M", "KC8UY", and "KC4UY" (manufactured by Konica Minolta Opto Device Co., Ltd.).

Examples of commercially available cyclic olefin type resins include "Topas" (trademark) (manufactured by Ticona (Germany)), "ARTON" (trademark) (manufactured by JSR Corporation), "ZEONOR" (trademark) and "ZEONEX" (trademark) (manufactured by ZEON Corporation), and "APEL" (trademark) (manufactured by Mitsui Chemicals Inc.). Such a cyclic olefin type resin may be used to make a film by known means such as a solvent cast method, and melt extrusion method, to thereby produce a base material. A commercially available cyclic olefin type resin material may be used. Examples of the commercially available cyclic olefin type resin material include "ESCENA" (trademark) and "SCA40" (trademark) (manufactured by Sekisui Chemical Co., Ltd.), "ZEONOR FILM" (trademark) (manufactured by Optes Inc.), and "ARTON FILM" (trademark) (manufactured by JSR Corporation).

The thickness of the base material is preferably lower from the viewpoint of the weight depending to the extent of practical handleability. However, too low thickness tends to bring about low strength and deteriorated processability. The thickness of the base material is usually 5 μm to 300 μm and preferably 20 μm to 200 μm.

<Orientation Film>

An orientation film is a film that has a thickness of 500 nm or less and exerts orientation limiting force to align liquid crystals of the polymerizable liquid crystal compound in a desired direction. Examples of an orientation polymer include an orientation film formed from an orientation polymer, photo-orientation film, and groove orientation film.

The orientation film makes easy the liquid crystal orientation of the polymerizable liquid crystal compound. The state of liquid crystal orientation such as horizontal orientation, vertical orientation, hybrid orientation, and oblique orientation varies depending on the properties of the orientation film and polymerizable liquid crystal compound and a combination of the orientation film and polymerizable liquid crystal compound may be optionally selected. If the orientation film is a material that exerts horizontal orientation as orientation limiting force, the polymerizable liquid crystal compound is able to form horizontal orientation or hybrid orientation, whereas if the orientation film is a material that exerts vertical orientation as orientation limiting force, the polymerizable liquid crystal compound is able to form vertical orientation or oblique orientation. The expression of "horizontal", "vertical", and the like indicates the direction of the major axis of the oriented polymerizable liquid crystal compound with respect to the plane of the polarizing film regarded as a reference plane. The horizontal orientation means an orientation expressed when the major axis of the oriented polymerizable liquid crystal compound is disposed in a direction parallel to an optical anisotropic layer surface. The term "parallel" so-called here means an angle of 0°±20° with the optical anisotropic layer surface. The vertical orientation means an orientation expressed when the major axis of the oriented polymerizable liquid crystal compound is disposed in a direction perpendicular to the plane of the polarizing film. The term "perpendicular" so-called here means an angle of 90°±20° with the plane of the polarizing film.

The orientation limiting force can be optionally controlled by the surface condition of the polymer and rubbing condition when the orientation film is formed from an orientation polymer, whereas the orientation limiting force can be optionally controlled, for example, by the condition of polarized light applied to the polymer when the orientation film is formed from a photo-orientation polymer. The liquid crystal orientation of the polymerizable liquid crystal compound can be controlled by selecting the properties such as surface tension and liquid crystallinity of the polymerizable liquid crystal compound.

As the orientation film formed between the base material and the polarizing film, a film is preferable which is insoluble in a solvent used in the formation of the polarizing film on the orientation film and has heat resistance in heat treatment performed to remove solvents and to align liquid crystals. Examples of the orientation film include an orientation film made from an orientation polymer, photo-orientation film, and groove orientation film.

The thickness of the orientation film is usually 10 nm to 500 nm and preferably 10 nm to 200 nm.

<Orientation Film Made from an Orientation Polymer>

The orientation film made from an orientation polymer is usually obtained by applying a composition (hereinafter also referred to as an orientation polymer composition) containing an orientation polymer dissolved in a solvent, to a base material, followed by removing a solvent, or obtained by applying an orientation polymer composition, followed by removing a solvent and rubbing (rubbing method).

The concentration of the orientation polymer in the orientation polymer composition is preferably 0.1% by mass to 20% by mass and more preferably 0.1% by mass to 10% by mass in terms of solid content based on the solution though no limitation is imposed thereon as long as the amount of the orientation polymer material falls within the range where the orientation polymer material can be perfectly dissolved in a solvent.

Examples of the commercially available orientation polymer composition include SUNEVER (trademark) (manufactured by Nissan Chemical Industries Ltd.) or OPTMER (trademark) (manufactured by JSR Corporation).

<Photo-Orientation Film>

The photo-orientation film is usually obtained by applying a composition (hereinafter also referred to as a photo-orientation film-forming composition) containing a polymer or monomer (photo-orientation material) having a photoreactive group and a solvent, to a base material and by applying polarized light (preferably polarized UV light) to the composition. The photo-orientation film is more preferable from the viewpoint that the direction of orientation limiting force can be optionally controlled by selecting the polarizing light direction of polarized light to be applied.

The photoreactive group means a group exhibiting liquid crystal orientation ability by irradiating it with light. Specifically, the photoreactive group is a group which offers molecular orientation induction or a group which undergoes a photoreaction such as an isomerization reaction, dimerization reaction, photo-crosslinking reaction, or photodecomposition reaction that is the origin of liquid crystal orientation ability when it is irradiated with light. Among these photoreactive groups, a group undergoing a dimerization reaction or photo-crosslinking reaction is preferable from the viewpoint that it has high orientation ability. As the photoreactive group capable of undergoing the above reaction, a group having an unsaturated bond and particularly a double bond is preferable and a group having at least one bond selected from the group consisting of a carbon-carbon double bond (C=C bond), carbon-nitrogen double bond (C=N bond), nitrogen-nitrogen double bond (N=N bond), and carbon-oxygen double bond (C=O bond) is particularly preferable.

The content of the polymer or monomer having a photoreactive group is preferably 0.2% by mass or more and particularly preferably 0.3% by mass to 10% by mass based on the photo-orientation film-forming composition. The photo-orientation film-forming composition may contain polymer materials such as polyvinyl alcohol and polyimide and photosensitizes to the extent that the properties of the photo-orientation film are significantly impaired.

The following system may be adopted to irradiate with polarized light: a system in which a composition obtained by removing a solvent from the photo-orientation film-forming composition applied to the substrate is directly irradiated with polarized light or a system in which polarized light is applied from the base material side to transmit the polarized light to the composition through the base material. The polarized light is particularly preferably substantially parallel light. The wavelength of the polarized light to be applied is desirably a wavelength in a wavelength range where a photoreactive group of the polymer or monomer having these photoreactive group is able to absorb light energy. Specifically, UV (ultraviolet rays) having a wavelength of 250 nm to 400 nm is especially preferable.

In this case, if masking is utilized when the applied composition is rubbed or irradiated with polarized light, a plurality of regions (patterns) differing in the direction of liquid crystal orientation may be formed.

<Groove Orientation Film>

The groove orientation film is a film having an irregular pattern or a plurality of grooves (channels) on its surface. When the polymerizable liquid crystal compound is applied to a film having a plurality of linear grooves arranged in a line at even intervals, liquid crystal molecules are aligned in a direction along the grooves.

Examples of a method used to obtain the groove orientation film include a method in which the surface of a photosensitive polyimide film is exposed to light through an exposure mask formed with pattern-shaped slits, followed by developing and rinsing to form an irregular pattern, a method in which a layer of an uncured UV-curable resin is formed on a plate-shaped precursor formed with grooves on the surface thereof and the resin layer is transferred to the base material, followed by curing, and a method in which a roll-shaped precursor formed with a plurality of grooves is pressed against a film of uncured UV-curable resin formed on a base material to form an irregular pattern, followed by curing. Specifically, examples of the method used to obtain a groove orientation film include methods described in JP-A-6-34976 and JP-A-2011-242743.

<Production Method>

Examples of a method of applying the composition of the present invention include the same methods as those exemplified as the method of applying the orientation polymer composition to the base material.

When the composition of the present invention contains a solvent, the solvent is usually removed from the formed coating film. Examples of a method of removing a solvent include natural drying, forced-air drying, and drying under heating or under reduced pressure.

The polymerization liquid crystal compound contained in the formed coating film is generally oriented by heating it to a temperature higher than the transition temperature at which the compound is changed into a solution state and then, by cooling the compound to a liquid crystal orientation temperature, to thereby form a liquid crystal phase.

The temperature at which the polymerizable liquid crystal compound contained in the formed coating film is oriented may be found in advance by, for example, texture observation using a composition containing the polymerizable liquid crystal compound. Also, the removal of a solvent and liquid crystal orientation may be performed at the same time. The temperature at this time is preferably in a range from 50 to 200° C. and more preferably in a range from 80 to 130°

C. when the base material is a resin material though depending on the kinds of solvent and polymerizable liquid crystal compound.

When, using a quarter wave plate as the base material, a circularly polarizing plate provided with the polarizing film of the present invention and the quarter wave plate is obtained, the direction of orientation of the polymerizable liquid crystal compound may be so designed that the transmission axis of the obtained polarizing film substantially crosses at an angle of 45° with the phase lag axis (optical axis) of the base material.

The oriented polymerizable liquid crystal compound is irradiated with active energy rays to thereby polymerize the polymerizable liquid crystal compound.

The oriented polymerizable liquid crystal compound is polymerized to thereby obtain a polarizing film including the polymerizable liquid crystal compound polymerized in an oriented state and the compound (1) oriented together with the polymerizable liquid crystal compound.

The polarizing film containing the polymerizable liquid crystal compound polymerized while keeping a smectic liquid crystal phase has higher polarizing ability as compared with a conventional guest-host type polarizing film, that is, a polarizing film obtained by polymerizing a polymerizable liquid crystal compound or the like while keeping a nematic liquid crystal phase, and also has higher polarizing ability and higher strength as compared with a polarizing film obtained by applying only a dichroic dye or a lyotropic liquid crystal type liquid crystal compound.

The light source of active energy rays may be light sources emitting ultraviolet rays, electron rays, X-rays, and the like. The light source is preferably light sources having an emission distribution at a wavelength of 400 nm or less such as a low-pressure mercury lamp, intermediate-pressure mercury lamp, high-pressure mercury lamp, ultra-high pressure mercury lamp, chemical lamp, black light lamp, microwave induction mercury lamp, and metal halide lamp.

The irradiation energy of active energy rays is so designed that the intensity of irradiation in a wavelength range effective for the activation of a polymerization initiator is preferably 10 to 5000 mJ/cm$^2$ and more preferably 100 to 2000 mJ/cm$^2$. If the energy of irradiation is less than 10 mJ/cm$^2$, the polymerizable liquid crystal compound tends to be cured insufficiently.

The thickness of a polarizing film thus formed according to the present invention is preferably in a range from 0.5 μm to 10 μm and more preferably in a range from 1 μm to 5 μm. The thickness of the polarizing film of the present invention may be found by measurement using an interference thickness meter, laser microscope, or contact type thickness meter.

The polarizing film of the present invention is particularly preferably a polarizing film which exhibits a Bragg peak in X-ray diffraction measurement. Examples of the polarizing film of the present invention which exhibits a Bragg peak include polarizing films exhibiting a diffraction peak specific to a hexatic phase or crystal phase.

The maximum absorption of the polarizing film of the present invention is observed in a range from 350 to 550 nm and more preferably in a range from 430 to 550 nm. This $\lambda_{max1}$ is preferably shifted towards longer wavelengths in contrast with a maximum absorption ($\lambda_{max2}$) measured when the compound (1) contained in the polarizing film of the present invention is dissolved in an appropriate solvent. Such a shift towards longer wavelengths is a shift that occurs when the compound (1) contained in the polarizing film of the present invention is dispersed between molecular chains formed by the polymerized polymerizable liquid crystal compound, indicating that the compound (1) strongly interacts with the molecular chains. The shift towards longer wavelengths implies that a difference between the absorption maximums ($\lambda_{max1}-\lambda_{max2}$) is positive and the difference is preferably 10 nm or more and more preferably 30 nm or more.

The dichroic ratio exhibited by the polarizing film of the present invention is 30 or more, preferably 40 or more, and more preferably 50 or more.

When the used base material is not a quarter wave plate, a circularly polarizing plate can be obtained by laminating the obtained polarizing film on a quarter wave plate. At this time, the both are preferably laminated in such a manner that the transmission axis of the obtained polarizing film substantially crosses at an angle of 45° with the phase lag axis (optical axis) of the quarter wave plate. Also, a circularly polarizing plate that functions as an optical compensation film can be obtained by making the transmission axis of the polarizing film of the present invention coincident or orthogonal to the optical axis of a phase difference film such as a quarter wave plate.

The lamination of the polarizing film of the present invention and the quarter wave plate may be performed either together with the base material formed with the polarizing film of the present invention or together with the base material formed with the orientation film or after removing the base material or the base material and orientation film. The lamination of the polarizing film of the present invention which is formed on the surface of the base material or base material formed with the orientation film and quarter wave plate is performed by applying the surface on which the polarizing film of the present invention is formed to the quarter wave plate by using an adhesive and then by removing the base material or the base material formed with the orientation film. In this case, the adhesive may be applied to either the polarizing film or the quarter wave plate.

<Application>

The polarizing film and the circularly polarizing plate may be used in various display devices.

Display devices are devices provided with display elements and respectively include an emitting element or emitting device as an emitting source. Examples of the display devices include liquid crystal display devices, organic electroluminescence (EL) display devices, inorganic electroluminescence (EL) display devices, touch panel display devices, electron emission display devices (field emission display devices (for example, FED) and surface electric field emission display devices (SED)), electronic paper (display devices using electronic ink or electrophoretic element), plasma display devices, projection type display devices (for example, grating light valve (GLV) display devices and digital micromirror devices (DMD)), and piezoelectric ceramic displays (DMD). The liquid crystal devices include transmission type liquid crystal display devices, transflective liquid crystal display devices, reflection type liquid crystal display devices, direct viewing type display devices, and projection type liquid crystal display devices. These display devices may be either display devices displaying two dimensional images or display devices displaying three-dimensional images. Particularly a circularly polarizing plate can be effectively used in organic EL display devices and inorganic EL display devices and the optical compensation polarizing plate can be effectively used in liquid crystal display devices and touch panel display devices.

The present invention is not limited to the aforementioned embodiments. Various modifications may be made within the scope described in claims and embodiments obtained by properly combining technical measures each disclosed in different embodiments are also embraced in the technical scope of the present invention. Also, novel technical features may be formed by combining technical measures disclosed in each embodiment.

EXAMPLES

The present invention will be explained in more detail by way of examples, which are, however, not intended to be limiting of the present invention, in which all designations of "%" and "parts" indicate "% by mass" and "parts by mass", respectively, unless otherwise noted.

Preparation of a Dichroic Dye

Dichroic dyes to be used in Examples were prepared by the methods described in the following Production Examples 1 to 5.

Production Example 1

[Chemical 26]

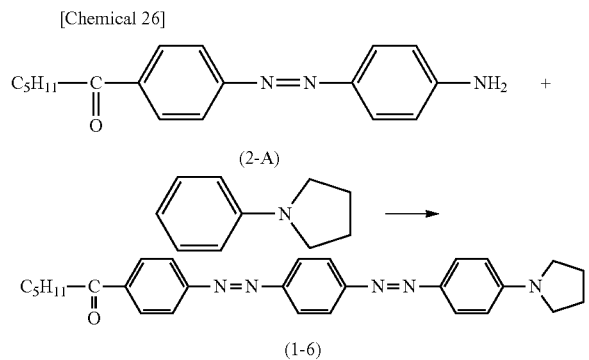

0.25 g of a compound represented by the formula (2-A), 2.5 g of acetic acid, 0.25 g of water, and 0.33 g of 35% hydrochloric acid were mixed. After the obtained mixture was cooled to 0° C., 0.24 g of an aqueous 33% sodium nitrite solution was added dropwise to the mixture. The obtained mixture was stirred for 30 minutes and then, 0.01 g of amidosulfuric acid was added to the mixture. The obtained mixture was added dropwise to a mixture of 0.31 g of N-phenylpyrrolidine, 0.34 g of sodium acetate, 9.4 g of methanol, and 4.7 g of water at 0° C. Then, a precipitate containing a compound (hereinafter referred to as a compound (1-6)) represented by the formula (1-6) was filtered from the resulting mixture and the obtained solid was refined by silica gel chromatography (eluent: chloroform). The obtained solid was washed with acetonitrile and then dried to thereby obtain 0.25 g of the compound (1-6) as a red solid. The properties and the like of the obtained compound are shown below.

Yield: (based on the compound represented by the formula (2-A)): 60%

$^1$H-NMR (CDCl$_3$) of the compound (1-6): δ (ppm) 0.93 (t, 3H), 1.38 (c, 4H), 1.78 (m, 2H), 2.08 (t, 4H) 3.02 (t, 2H), 3.44 (t, 4H), 3.48 (q, 4H), 6.65 (d, 2H), 7.90-8.13 (c, 10H).

Production Example 2

[Chemical 27]

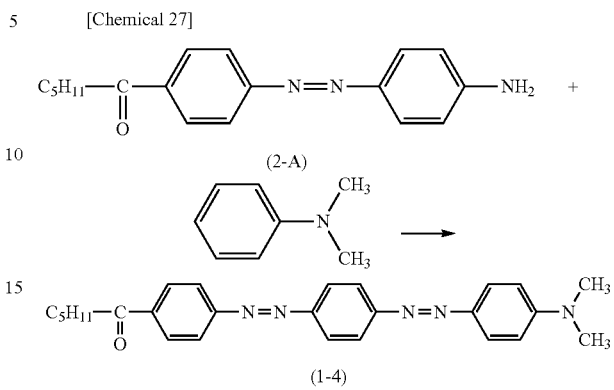

0.14 g of a compound (hereinafter referred to as a compound (1-4)) represented by the formula (1-4) was obtained as a red solid in the same operation as in Production Example 1 except that N,N-dimethylaniline was used in place of N-phenylpyrrolidine described in Production Example 1. The properties and the like of the obtained compound are shown below.

Yield: (based on the compound represented by the formula (2-A)): 33%

$^1$H-NMR (CDCl$_3$) of the compound (1-4): δ (ppm) 0.93 (t, 3H), 1.38 (c, 4H), 1.78 (m, 2H), 3.02 (t, 2H), 3.11 (s, 6H), 6.76 (d, 2H), 7.91-8.13 (c, 10H).

Production Example 3

[Chemical 28]

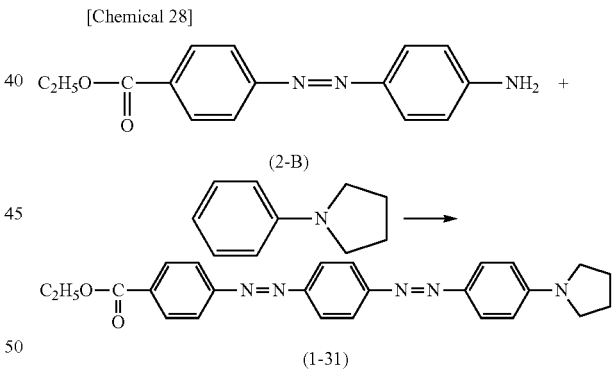

0.25 g of a compound (hereinafter referred to as a compound (1-31)) represented by the formula (1-31) was obtained as a red solid in the same operation as in Production Example 1 except that a compound (hereinafter also referred to as a compound 2-B) represented by the formula (2-B) was used in place of the compound 2-A, the amount of the aqueous 33% sodium nitrite solution to be added dropwise was altered to 0.26 g, and 0.33 g of N-phenylpyrrolidine and 0.36 g of sodium acetate were used. The properties and the like of the obtained compound are shown below.

Yield: (based on the compound represented by the formula (2-B)): 58%

$^1$H-NMR (CDCl$_3$) of the compound (1-31): δ (ppm) 1.43 (t, 3H), 2.07 (t, 4H), 3.44 (t, 4H), 4.42 (q, 2H), 6.63 (d, 2H), 7.90-8.22 (c, 10H).

Production Example 4

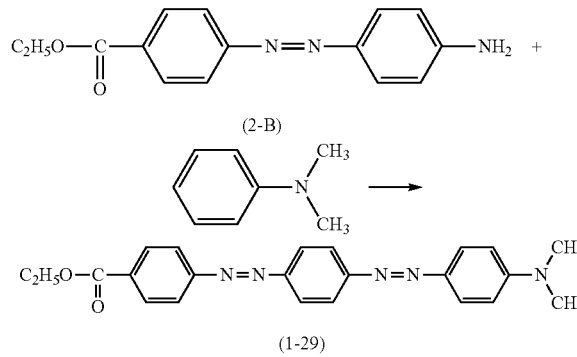

(1-29)

0.20 g of a compound (hereinafter referred to as a compound (1-29)) represented by the formula (1-29) was obtained as a red solid in the same operation as in Production Example 3 except that N,N-dimethylaniline was used in place of N-phenylpyrrolidine described in Production Example 3. The properties and the like of the obtained compound are shown below.

Yield: (based on the compound represented by the formula (2-B)): 48%

$^1$H-NMR (CDCl$_3$) of the compound (1-29): δ (ppm) 1.43 (t, 3H), 3.10 (s, 6H), 4.42 (q, 2H), 6.77 (d, 2H), 7.91-8.22 (c, 10H).

Production Example 5

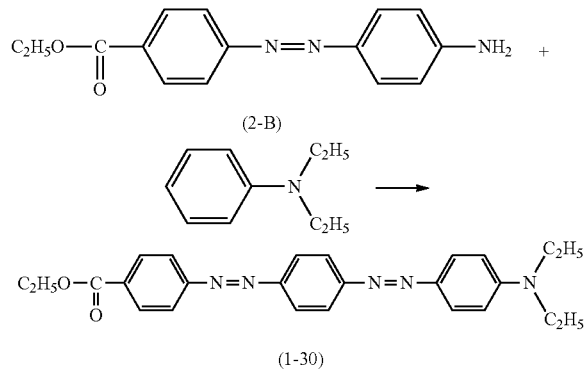

(1-30)

0.21 g of a compound (hereinafter referred to as a compound (1-30)) represented by the formula (1-30) was obtained as a red solid in the same operation as in Production Example 3 except that N,N-diethylaniline was used in place of N-phenylpyrrolidine described in Production Example 3. The properties and the like of the obtained compound are shown below.

Yield: (based on the compound represented by the formula (2-B)): 50%

$^1$H-NMR (CDCl$_3$) of the compound (1-30): δ (ppm) 1.25 (t, 6H), 1.43 (t, 3H), 3.46 (q, 4H), 4.42 (q, 2H), 6.74 (d, 2H), 7.89-8.22 (c, 10H).

Production Example 6

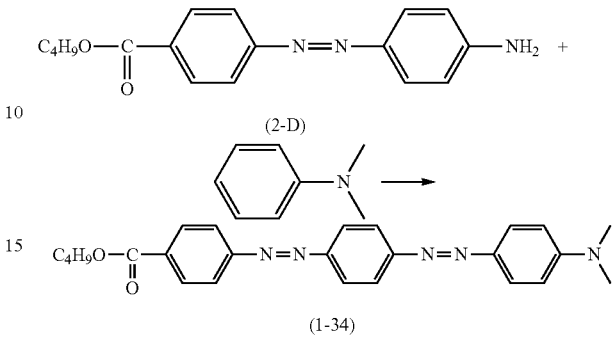

(1-34)

0.09 g of a compound (hereinafter referred to as a compound (1-34)) represented by the formula (1-34) was obtained as a red solid in the same operation as in Production Example 3 except that N,N-dimethylaniline was used in place of N-phenylpyrrolidine described in Production Example 3 and a compound represented by the formula (2-D) was used in place of the compound 2-B. The properties and the like of the obtained compound are shown below.

Yield: (based on the compound represented by the formula (2-D)): 67%

$^1$H-NMR (CDCl$_3$) of the compound (1-34): δ (ppm) 1.01 (t, 3H), 1.40-1.60 (m, 2H), 1.72-1.86 (m, 2H), 31.2 (s, 6H), 4.37 (t, 2H), 6.77 (d, 2H), 7.90-8.24 (m, 10H).

Production Example 7

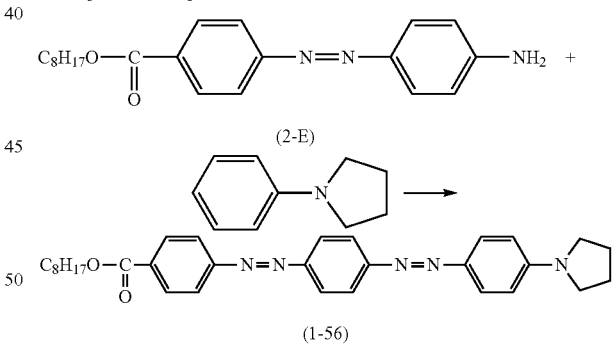

(1-56)

0.12 g of a compound (hereinafter referred to as a compound (1-56)) represented by the formula (1-56) was obtained as a red solid in the same operation as in Production Example 3 except that a compound represented by the formula (2-E) was used in place of the compound 2-B described in Production Example 3. The properties and the like of the obtained compound are shown below.

Yield: (based on the compound represented by the formula (2-E)): 15%

$^1$H-NMR (CDCl$_3$) of the compound (1-56): δ (ppm) 0.90 (t, 3H), 1.20-1.70 (m, 10H), 1.75-1.90 (m, 2H), 2.00-2.20 (m, 4H), 3.35-3.50 (m, 4H), 4.36 (t, 2H), 6.64 (d, 2H), 7.85-8.25 (m, 10H).

Example 8

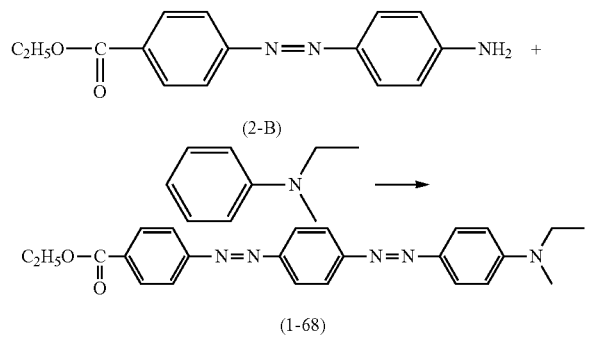

0.32 g of a compound (hereinafter referred to as a compound (1-68)) represented by the formula (1-68) was obtained as a red solid in the same operation as in Production Example 3 except that N-ethyl-N-methylaniline was used in place of N-phenylpyrrolidine described in Production Example 3. The properties and the like of the obtained compound are shown below.

Yield: (based on the compound represented by the formula (2-B)): 52%

$^1$H-NMR (CDCl$_3$) of the compound (1-68): δ (ppm) 1.22 (t, 3H), 1.43 (t, 3H), 3.06 (s, 3H), 3.52 (m, 2H), 4.42 (m, 2H), 6.76 (d, 2H), 7.90-8.25 (m, 10H).

Preparation of a Polymerizable Liquid Crystal Compound

Polymerizable liquid crystal compounds used in Examples were prepared by the methods described in the following Production Examples 9 and 10.

Production Example 9 and 10

A compound (hereinafter referred to as a compound (4-6)) represented by the following formula (4-6) was obtained by using a synthetic method described in Lub et al. Recl. Trav. Chim. Pays-Bas, 115, 321-328 (1996). Also, a compound (hereinafter referred to as a compound (4-8)) represented by the following formula (4-8) was obtained by using a method according to the above method.

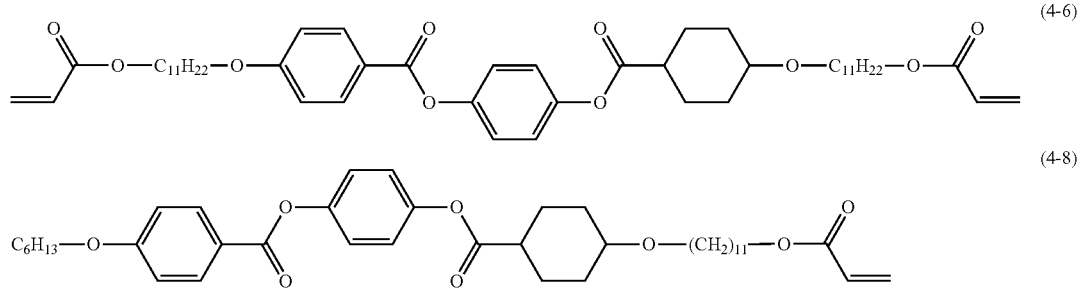

Measurement of Phase Transition Temperature

The phase transition temperature of the compound (4-6) was confirmed. The confirmation operation is as follows.

About 10 mg of a powder of the compound (4-6) was placed on a glass substrate on which an orientation film was formed and a cover glass was placed on the powder. Then, the glass substrate was heated to dissolve the powder of the compound (4-6) into an isotropic state. Thereafter, the texture of the dissolved compound (4-6) was observed by a polarizing microscope (BX-51, manufactured by Olympus Corporation). As a result, it was found by observation that the compound (4-6) was dissolved into an isotropic state by raising the temperature of the compound to 120° C. and transited to a nematic phase at 112° C., to a smectic-A phase at 110° C., and to a smectic-B phase at 94° C. during the temperature drop.

The phase transition temperature of the compound (4-8) was confirmed in the same manner as in the measurement of the phase transition temperature of the compound (4-6). It was found by observation that the compound (4-8) was dissolved into an isotropic state by raising the temperature of the compound to 140° C. and transited to a nematic phase at 131° C., to a smectic-A phase at 80° C., and to a smectic-B phase at 68° C. during the temperature drop.

Preparation of a Composition, Production and Evaluation of a Polarizing Film

Example 1

Preparation of a Composition

The following ingredients were mixed in the following ratio and stirred at 80° C. for 1 hour to obtain a composition (1).

| Compound (1): | Compound (1-6) | 2.5 parts |
|---|---|---|

Polymerizable Liquid Crystal Compound:

| | |
|---|---|
| Compound (4-6) | 75 parts |
| Compound (4-8) | 25 parts |
| Polymerization initiator: 2-dimethylamino-2-benzyl-1-(4-morpholinophenyl)butan-1-one (Irgacure 369, Ciba Specialty Chemicals Co., Ltd.) | 6 parts |
| Leveling agent: Polyacrylate compound (BYK-361N, manufactured by BYK-Chemie GmbH Company) | 1.5 parts |
| Solvent: Chloroform | 250 parts |

Measurement of Phase Transition Temperature

The phase transition temperature of a component (polymerizable liquid crystal compound) contained in the composition (1) was measured in the same operation as in the measurement of the phase transition temperature of the compound (4-6).

As a result, it was found by observation that the component was dissolved into an isotropic state by raising the temperature of the component to 140° C. and transited to a nematic phase at 115°, to a smectic-A phase at 105°, and to a smectic-B phase at 75° C. during the temperature drop.

Production of a Polarizing Film

A polarizing film was manufactured by the following steps 1 and 2.

Step 1: Formation of an Orientation Film

An aqueous 2 mass % polyvinyl alcohol (Polyvinyl Alcohol 1000, fully saponified type, manufactured by Wako Pure Chemical Industries, Ltd.) was applied to a glass substrate by a spin coating method and dried to form a film 100 nm in thickness. Then, rubbing treatment of the surface of the obtained film was performed to form an orientation film. The rubbing treatment was performed using a Semi-Automatic Rubbing Machine (trade name: LQ-008-model, manufactured by Joyo Engineering Co., Ltd.) and a cloth (trade name: YA-20-RW, manufactured by Yoshikawa Chemical Co., Ltd.) in the following condition: pushing depth: 0.15 mm, number of rotations: 500 rpm, and 16.7 mm/s. A laminate 1 with an orientation film formed on a glass substrate was obtained by this rubbing treatment.

Step 2: Formation of a Polarizing Film

The composition (1) was applied to the orientation film of the laminate 1 by a spin coating method, dried under heating at 120° C. on a hot plate for 1 minute, then rapidly cooled to ambient temperature to form a dried coating film containing a polymerizable liquid crystal compound oriented on the above orientation film. Next, using a UV irradiation apparatus (SPOT CURE SP-7, manufactured by Ushio Inc.), the dried coating film was irradiated with ultraviolet rays at an exposure dose of 2000 mJ/cm$^2$ (365 nm base) to polymerize the polymerizable liquid crystal compound contained in the dried coating film with keeping oriented state. A polarizing film (1) was thus formed from the dried coating film to obtain a laminate 2. The thickness of the polarizing film at this time was measured using a laser microscope (OLS3000, manufactured by Olympus Corporation), to find that it was 1.7 μm.

Evaluation of a Polarizing Film (a) X-Ray Diffraction Measurement

X-ray diffraction measurement for the polarizing film (1) was made using an X-ray diffractometer X' Pert PRO MPD (manufactured by Spectris Co., Ltd.). The measurement was made in the following manner: the rubbing direction of the orientation film lying under the polarizing film was found in advance, and, using Cu as a target, X-rays created in the condition of an X-ray tube current of 40 mA and X-ray tube voltage of 45 kV were made incident from the above rubbing direction through a fixed divergence slit ½° to scan in the following condition: scan range 2θ=4.0 to 40.0° and scan step size 2θ=0.01671°. As a result, a sharp diffraction peak (Bragg peak) having a half value width (FWHM)=about 0.31° was obtained in the vicinity of 2θ=20.1°. The same results were also obtained when X-rays were made incident from a direction perpendicular to the rubbing direction. The order period (d) found from the peak position was about 0.44 nm, to find that the polarizing film formed a structure on which a higher-order smectic phase was reflected.

(b) Measurement of a Dichroic Ratio

The absorbance ($A^1$) in the direction of the transmission axis and the absorbance ($A^2$) in the direction of the absorption axis at a maximum absorption wavelength were measured using a device in which a folder provided with the laminate 2 was set to a spectrophotometer (UV-3150, manufactured by Shimadzu Corporation) according to a double beam method. This folder was provided with a mesh for cutting 50% of the quantity of light on the reference side. The ratio ($A^2/A^1$) was calculated as the dichroic ratio from the measured absorbance ($A^1$) in the transmission axis and the measured absorbance ($A^2$) in the direction of the absorption axis. The maximum absorption wavelength ($\lambda_{max1}$) was 540 nm and the dichroic ratio at this wavelength was 42.

(c) Test for Light Fastness

The absorbance was measured again after a protective film (40 μm TAC ("KC4UY" manufactured by Konica Minolta, Inc.)) was disposed on the surface of the formed polarizing film (1) and light was applied from the surface of the protective film in the following condition and the absorbances at a maximum absorption wavelength after and before the above light irradiation were compared with each other, thereby evaluating the light fastness of the polarizing film (1). The absorbance of the polarizing film (1) at a maximum absorption wavelength of 540 nm after the test for light fastness was 87% of the absorbance measured before the test.

The light irradiation condition in the test for light fastness is as follows:

Working equipment: Santest XLS+, manufactured by ATLAS Company
Working light source: Xenon Arc lamp
Exposure condition: 250 mW/m$^2$
Test time: 120 hours
Exposure dose: 108000 KJ/m$^2$
Temperature: 60° C.

Example 2

A composition (2) was prepared and a polarizing film (2) was formed in the same operation as in Example 1 except that the compound (1-4) prepared in Production Example 2 was used in place of the compound (1-6). Then, the maximum absorption wavelength and dichroic ratio of the polarizing film (2) were measured in the same manner as in Example 1. As a result, the maximum absorption wavelength ($\lambda_{max1}$) was 542 nm and the dichroic ratio at this wavelength was 40.

Also, a test for the light fastness of the polarizing film (2) was made in the same condition as in Example 1, to find that the absorbance of the polarizing film (2) after the test for light fastness was 91% of the absorbance measured before the test.

Example 3

A composition (3) was prepared and a polarizing film (3) was formed in the same operation as in Example 1 except that the compound (1-31) prepared in Production Example 3 was used in place of the compound (1-6). Then, the maximum absorption wavelength and dichroic ratio of the polarizing film (3) were measured in the same manner as in Example 1. As a result, the maximum absorption wavelength ($\lambda_{max1}$) was 542 nm and the dichroic ratio at this wavelength was 52.

Also, a test for the light fastness of the polarizing film (3) was made in the same condition as in Example 1, to find that the absorbance of the polarizing film (3) after the test for light fastness was 90% of the absorbance measured before the test.

Example 4

A composition (4) was prepared and a polarizing film (4) was formed in the same operation as in Example 1 except that the compound (1-29) prepared in Production Example 4 was used in place of the compound (1-6). Then, the maximum absorption wavelength and dichroic ratio of the polarizing film (4) were measured in the same manner as in Example 1. As a result, the maximum absorption wavelength ($\lambda_{max1}$) was 542 nm and the dichroic ratio at this wavelength was 50.

Also, a test for the light fastness of the polarizing film (3) was made in the same condition as in Example 1, to find that the absorbance of the polarizing film (4) after the test for light fastness was 91% of the absorbance measured before the test.

Example 5

A composition (5) was prepared and a polarizing film (5) was formed in the same operation as in Example 1 except that the compound (1-30) prepared in Production Example 5 was used in place of the compound (1-6). Then, the maximum absorption wavelength and dichroic ratio of the polarizing film (5) were measured in the same manner as in Example 1. As a result, the maximum absorption wavelength ($\lambda_{max1}$) was 540 nm and the dichroic ratio at this wavelength was 36.

Also, a test for the light fastness of the polarizing film (5) was made in the same condition as in Example 1, to find that the absorbance of the polarizing film (5) after the test for light fastness was 88% of the absorbance measured before the test.

Example 6

A composition (6) was prepared and a polarizing film (6) was formed in the same operation as in Example 1 except that the compound (1-34) prepared in Production Example 6 was used in place of the compound (1-6). Then, the maximum absorption wavelength and dichroic ratio of the polarizing film (6) were measured in the same manner as in Example 1. As a result, the maximum absorption wavelength ($\lambda_{max1}$) was 542 nm and the dichroic ratio at this wavelength was 49.

Also, a test for the light fastness of the polarizing film (6) was made in the same condition as in Example 1, to find that the absorbance of the polarizing film (6) after the test for light fastness was 90% of the absorbance measured before the test.

Example 7

A composition (7) was prepared and a polarizing film (7) was formed in the same operation as in Example 1 except that the compound (1-56) prepared in Production Example 7 was used in place of the compound (1-6). Then, the maximum absorption wavelength and dichroic ratio of the polarizing film (7) were measured in the same manner as in Example 1. As a result, the maximum absorption wavelength ($\lambda_{max1}$) was 548 nm and the dichroic ratio at this wavelength was 45.

Also, a test for the light fastness of the polarizing film (7) was made in the same condition as in Example 1, to find that the absorbance of the polarizing film (7) after the test for light fastness was 92% of the absorbance measured before the test.

Example 8

A composition (8) was prepared and a polarizing film (8) was formed in the same operation as in Example 1 except that the compound (1-68) prepared in Production Example 8 was used in place of the compound (1-6). Then, the maximum absorption wavelength and dichroic ratio of the polarizing film (8) were measured in the same manner as in Example 1. As a result, the maximum absorption wavelength ($\lambda_{max1}$) was 542 nm and the dichroic ratio at this wavelength was 48.

Also, a test for the light fastness of the polarizing film (8) was made in the same condition as in Example 1, to find that the absorbance of the polarizing film (8) after the test for light fastness was 89% of the absorbance measured before the test.

Comparative Example 1

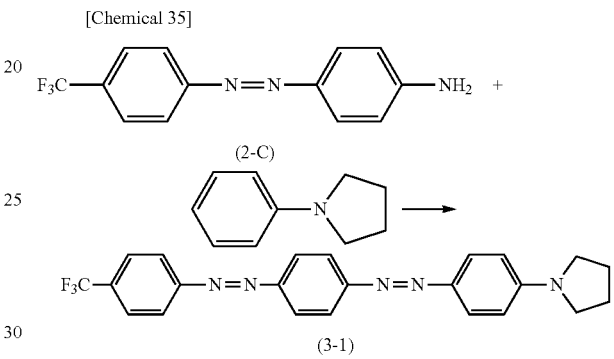

0.31 g of a compound (hereinafter referred to as a compound (3-1)) was obtained as a red solid in the same operation as in Production Example 1 except that (2-C) was used in place of (2-A) described in Production Example 1. In this case, the compound (3-1) is a compound which is described in JP-A-2013-101328 and is conventionally known as a dichroic dye to be contained in polarizing films.

A comparative polarizing film (6) was formed in the same operation as in Example 1 except that the compound (3-1) was used in place of the compound (1-6). Then, a test for the light fastness of the comparative polarizing film (6) was made in the same manner as in Example 1, to find that the absorbance of the comparative polarizing film (6) at the maximum absorption wavelength ($\lambda_{max1}$) of 548 nm after the test for light fastness was 47% of the absorbance measured before the test.

CONCLUSION

It is found from the results of the test for light fastness in Examples 1 to 8 and Comparative Example 1 that each polarizing film formed in Examples is superior in light fastness to the polarizing film containing the compound (3-1) having the same structure as the compound (1) except that its terminal group E is neither the electron attractive group having 3 or more carbon atoms nor the substituent (X). It is therefore found that the polarizing film of the present invention, that is, a polarizing film formed from the composition of the present invention has more excellent light fastness than a polarizing film containing a conventional dichroic dye.

A polarizing film, formed from the composition of the present invention or the polarizing of the present invention are superior in light fastness to a conventional polarizing film. Therefore, the polarizing film according to the present invention can be widely used in production fields of liquid crystal display devices, liquid crystal cells, circularly polarizing plates, and organic EL display devices.

What is claimed is:

1. A composition comprising a polymerizable liquid crystal compound and a compound represented by the following formula (1):

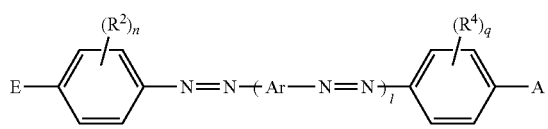

wherein E represents the following formula:

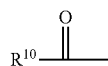

wherein $R^{10}$ represents a hydrocarbon group having 2 to 20 carbon atoms,
or the following group:

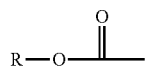

wherein R represents a hydrogen atom or a hydrocarbon group having 1 to 20 carbon atoms;
Ar represents a group selected from the following groups:

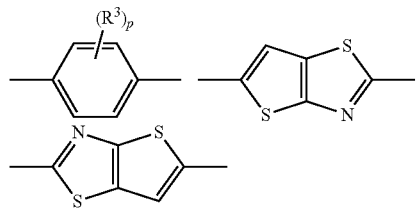

and A represents a group selected from the following groups:

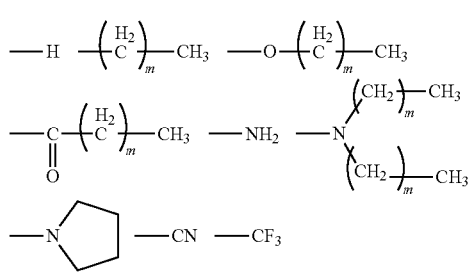

wherein $R^2$, $R^3$ and $R^4$, which are substituents other than a hydrogen atom, respectively represent an alkyl group having 1 to 4 carbon atoms, an alkoxy group having 1 to 4 carbon atoms, a halogen atom, or a cyano group, wherein one or more hydrogen atoms constituting the alkyl group and alkoxy group may be substituted with a halogen atom or a hydroxy group, l denotes 1 or 2, m denotes an integer from 0 to 10 provided that when two m(s) are present in the same group, they may be the same or different, and n, p, and q respectively denote an integer from 0 to 2.

2. The composition according to claim 1, wherein the substituent constant $\sigma_p^0$ of the electron attractive group is positive.

3. The composition according to claim 2, wherein the substituent constant $\sigma_p^0$ of the electron attractive group is 0.3 to 1.

4. The composition according to claim 1, wherein the polymerizable liquid crystal compound is a polymerizable smectic liquid crystal compound.

5. The composition according to claim 1, the composition further comprising a polymerization initiator.

6. A polarizing film comprising a polymer of a polymerizable liquid crystal compound and a compound represented by the following formula (1):

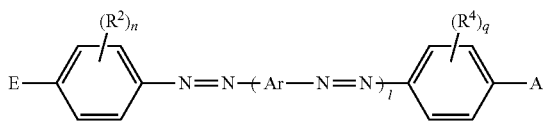

wherein E represents the following formula:

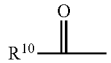

wherein $R^{10}$ represents a hydrocarbon group having 2 to 20 carbon atoms,
or the following group:

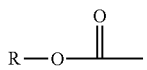

wherein R represents a hydrogen atom or a hydrocarbon group having 1 to 20 carbon atoms;
Ar represents a group selected from the following groups:

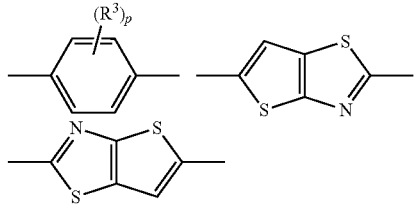

and A represents a group selected from the following groups:

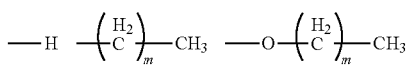

-continued

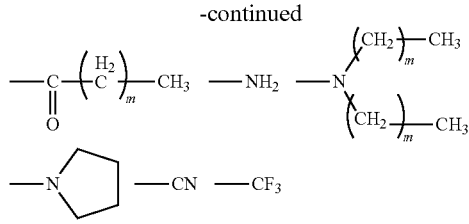

wherein $R^2$, $R^3$ and $R^4$, which are substituents other than a hydrogen atom, respectively represent an alkyl group having 1 to 4 carbon atoms, an alkoxy group having 1 to 4 carbon atoms, a halogen atom, or a cyano group, wherein one or more hydrogen atoms constituting the alkyl group and alkoxy group may be substituted with a halogen atom or a hydroxy group, l denotes 1 or 2, m denotes an integer from 0 to 10 provided that when two m(s) are present in the same group, they may be the same or different, and n, p, and q respectively denote an integer from 0 to 2.

7. The polarizing film according to claim 6, wherein the substituent constant $\sigma_p^0$ of the electron attractive group is positive.

8. The polarizing film according to claim 7, wherein the substituent constant $\sigma_p^0$ of the electron attractive group is 0.3 to 1.

9. The polarizing film according to claim 6, wherein the polymer of the polymerizable liquid crystal compound exhibits a polymerizable smectic liquid crystal phase.

10. The polarizing film according to claim 6, the polarizing film exhibiting a Bragg peak in X-ray diffraction measurement.

11. A circularly polarizing plate comprising the polarizing film as claimed in claim 6.

12. A liquid crystal display device comprising the polarizing film as claimed in claim 6.

13. An organic electroluminescence display comprising the circularly polarizing plate as claimed in claim 11.

* * * * *